US011258439B2

(12) United States Patent
Shapiro et al.

(10) Patent No.: US 11,258,439 B2
(45) Date of Patent: Feb. 22, 2022

(54) HIGH-VOLTAGE FAST SWITCHING DEVICES

(71) Applicant: VISIC TECHNOLOGIES LTD., Nes Ziona (IL)

(72) Inventors: David Shapiro, Rishon le Zion (IL); Ilia Bunin, Holon (IL); Oleg Dubinsky, Bet-Shemesh (IL)

(73) Assignee: VisIC Technologies Ltd.

(*) Notice: Subject to any disclaimer, the term of this patent is extended or adjusted under 35 U.S.C. 154(b) by 0 days.

(21) Appl. No.: 16/645,122

(22) PCT Filed: Sep. 6, 2018

(86) PCT No.: PCT/IL2018/051021
§ 371 (c)(1),
(2) Date: Mar. 6, 2020

(87) PCT Pub. No.: WO2019/049158
PCT Pub. Date: Mar. 14, 2019

(65) Prior Publication Data
US 2021/0111714 A1 Apr. 15, 2021

Related U.S. Application Data

(60) Provisional application No. 62/555,062, filed on Sep. 7, 2017, provisional application No. 62/727,011, filed on Sep. 5, 2018.

(51) Int. Cl.
*H03K 17/10* (2006.01)
*H03K 17/0812* (2006.01)
*H03K 17/296* (2006.01)

(52) U.S. Cl.
CPC ..... *H03K 17/102* (2013.01); *H03K 17/08122* (2013.01); *H03K 17/296* (2013.01)

(58) Field of Classification Search
CPC ............. H03K 17/00; H03K 17/04123; H03K 17/04126; H03K 17/04213; H03K 17/063;
(Continued)

(56) References Cited

U.S. PATENT DOCUMENTS 4,716,313 A 12/1987 Hori et al.
5,616,970 A 4/1997 Dittrich
(Continued)

FOREIGN PATENT DOCUMENTS

CN 105978300 A 9/2016
DE 10104515 A1 7/2002

OTHER PUBLICATIONS

International Search Report dated Jan. 3, 2019, for Application No. PCT/IL2018/051021.
(Continued)

*Primary Examiner* — Lincoln D Donovan
*Assistant Examiner* — Dave Mattison
(74) *Attorney, Agent, or Firm* — Conley Rose, P.C.

(57) ABSTRACT

A device for switching a high-voltage source, comprising: a plurality of switching devices coupled in series starting from a first switching device and ending in a last switching device, said device enabling coupling of said high-voltage source with at least a selected one of said switching devices; a voltage limiter coupled with said switching devices; and a switching time synchronizer; wherein said first switching device is configured to directly receive a control signal for changing a switching state of said device, said first switching device is configured to facilitate a cascaded transition of switching states in successive said switching devices in said series, where said switching time synchronizer is configured to synchronize a time at which transitions to said switching states of successive said switching devices take effect, and
(Continued)

said voltage limiter is configured to limit overvoltage conditions to said switching devices during said transitions.

32 Claims, 15 Drawing Sheets

(58) Field of Classification Search
CPC ........... H03K 17/08122; H03K 17/102; H03K 17/296; H03K 17/567
USPC ........................................................ 327/374
See application file for complete search history.

(56) References Cited

U.S. PATENT DOCUMENTS

| | | |
|---|---|---|
| 9,190,993 B1 | 11/2015 | Li |
| 2012/0262220 A1* | 10/2012 | Springett ............. H03K 17/567 327/430 |
| 2013/0057332 A1 | 3/2013 | Aggeler et al. |
| 2015/0043116 A1 | 2/2015 | Weyers et al. |

OTHER PUBLICATIONS

Juergen Biela et al: "Balancing Circuit for a 5kV/50-ns Pulsed-Power Switch Based on SiC-JFET Super Cascode", IEEE Transactions on Plasma Science, IEEE Service Center, kPiscataway, NJ, US, vol. 40, No. 10, Oct. 1, 2010, pp. 2554-2560, XP011466751, ISSN: 0093-3813, DOI: 10.1109/TPS.2011.2169090.
Extended European Search Report dated Jul. 7, 2021, for Application No. EP 18853504.1 (7 pgs).

* cited by examiner

HIGH-VOLTAGE FAST SWITCHING DEVICES

CROSS-REFERENCE TO RELATED APPLICATIONS

This application is a 35 U.S.C. § 371 national stage application of PCT/IL2018/051021 filed Sep. 6, 2018, and entitled "High-Voltage Fast Switching Devices," which claims benefit of U.S. application No. 62/555,062 filed on Sep. 7, 2017, and U.S. application No. 62/727,011 filed on Sep. 5, 2018, both of which are incorporated herein by reference in their entirety for all purposes.

FIELD OF THE DISCLOSED TECHNIQUE

The disclosed technique relates to switching devices, in general, and to high-voltage fast switching devices, in particular.

BACKGROUND OF THE DISCLOSED TECHNIQUE

Various systems and devices, such as televisions, electrically powered vehicles, radar systems, electric motor controllers, uninterrupted power supply systems and the like, require a relatively large amount of electrical power, supplied from power supplies including those of high-voltage. The supply of the voltage to such devices may typically be controlled via semiconductor switching devices.

High-voltage semiconductor switching devices are generally known in the art. One such prior art architecture, for example, employs a 'cascode' configuration employing, for example, two or more transistors. The cascode configuration enables the voltage across the switching device to be higher than the individual breakdown voltage of each transistor. Reference is now made to FIG. 1, which is a schematic illustration of an exemplary high-voltage semiconductor switching device, generally referenced 10, which is known in the art. Switching device 10 employs a series configuration. Switching device 10 includes two switching circuits, a first switching device $12_1$ and a second switching device $12_2$. First switching device $12_1$ includes a transistor $14_1$ a first resistor $16_1$, a second resistor $16_2$ and a first capacitor $20_1$ and a second capacitor $20_2$. First switching device $12_1$ and second switching device $12_2$ are, for example, transistors such as transistors $14_1$ and transistor $14_2$ respectively. Transistor $14_1$ includes a substrate terminal $22_1$, a drain terminal (D) $24_1$ a gate terminal (G) $26_1$ and a source terminal (S) $28_1$. Transistor $14_2$ includes a silicon substrate terminal $22_2$, a drain terminal (D) $24_2$ a gate terminal (G) $26_2$ and a source terminal (S) $28_2$. Transistor $14_1$ may be chosen as "normally on" or as "normally off". Similarly, transistor $14_2$ may be chosen as "normally on" or as "normally off", regardless of the normal state of transistor $14_1$.

High-voltage semiconductor switching device 10 has three operation states. The first state is an "off state" also referred to as a "static state". In the "off state", at least one of transistors $14_1$ and $14_2$ is in the "off state" thereof. The second state is an "on state". In the "on state" both transistors $14_1$ and $14_2$ are in the "on state". The third state is a transient state, which occurs when transistors $14_1$ and $14_2$, are switched from the "off state" to the "on state", and vice versa. The two transistors have to be in the same state.

Source terminal $28_1$ is coupled with drain terminal $24_2$. One terminal of resistor $16_1$ is coupled with drain $24_1$ and the other terminal of resistor $16_1$ is coupled with source $28_1$. Also, one terminal of resistor $16_2$ is coupled with drain $24_2$ and the other terminal of resistor $16_2$ is coupled with source $28_2$. Similarly, one terminal of capacitor $20_1$ is coupled with drain $24_1$ and the other terminal of capacitor $20_1$ is coupled with source $28_1$. Similarly, one terminal of capacitor $20_2$ is coupled with drain $24_2$ and the other terminal of capacitor $20_2$ is coupled with source $28_2$.

Typically, the values of resistors $16_1$, $18_1$, $16_2$ and $18_2$ are each on the order of mega-Ohms (MΩ). Resistors $16_1$ and $16_2$ exhibit equal values, typically on the order of mega-Ohms (MΩ). Capacitors $20_1$ and $20_2$ also exhibit equal values. Resistors $16_1$ and $16_2$ along with capacitors $20_1$ and $20_2$ from a voltage divider, which enables substantially equal steady and transient voltage across transistors $14_1$ and $14_2$.

U.S. Patent Application Publication No.: US 2012/0262220 A1 to Springett directs to a switching device that includes a normally-off transistor and a normally-on transistor in cascode arrangement. The switching device further includes a capacitor connected between the gate of the normally-on device and the source of the normally-off device, and a Zener diode connected in parallel with the capacitor. The normally-on device can be a JFET such as a SiC JFET. The normally-off device can be a MOSFET such as a Si MOSFET. The normally-on device is a high voltage device and the normally-off device is a low voltage device. When the device is turned off, the capacitor charges and the voltage there across is the voltage of the breaking voltage of the Zener diode. When the normally-off MOSFET is turned on (i.e., with a control voltage), the source of the normally-on JFET connects to ground and the Vgs of the normally-on device becomes positive, turning the normally-on JFET, off.

U.S. Pat. No. 4,459,498 to Stengl et al. entitled "Switch with Series-Connected MOS-FETs" directs to a switch, having at least two series-connected power MOS-FETs, denoted as "FET 1" and "FET 2". The drain of FET 1 is connected to the source terminal of FET 2. The gate of FET 1 is connected to a control voltage. A second input terminal is at the potential of the source of FET 1. The gate of FET 1 is further connected to gate of FET 2 via a diode. The diode has a cut-off voltage at least as high as the breakdown voltage of FET 2. The gate of FET 2 is electrically connected to the source thereof via a resistor. Shunted across the resistor is the input capacitance of the FET 2, which is shown symbolically by broken-line connections. With a positive voltage pulse to the gate of FET 1 it becomes conducting and the potential at the connection point between the transistors drops. When the potential connection point between the transistors drops to a level such that the gate voltage of FET 2 and the control voltage are lower than the threshold voltage of the diode, then the diode begins to conduct and FET 2 becomes conducting. To turn off the switch, the negative voltage pulse is applied to the gate of FET 1 and the process is reversed.

According to a further example directed to by Stengl, a Zener diode is connected between the drain and gate of FET 2, to which another diode is connected with opposite polarity. This Zener diode has a Zener voltage which is slightly smaller than the breakdown voltage of the FET 2. With an input voltage applied to gate of FET 1 it becomes conducting. The potential at connection points between the transistors drops and a current can flow through and the Zener diode (i.e., when the Zener diode breaks down). This current produces a voltage drop on the resistor, which charges the input capacitance of FET 2. When the cut-off voltage is exceeded, FET 2 becomes conducting without having the entire operating voltage applied thereto. If the voltage applied to the FET 2 drops below the Zener voltage, the Zener diode cuts off and FET 2 is kept conducting via the diode. When the switch is opened (i.e., disconnected), FET 1 is cut off and the Zener diode 8 goes into a cut-off state. The diode is likewise cut off and the input capacitance can discharge via the resistor. FET 2 is thereby also cut off.

A publication entitled "Balancing Circuit for a 5 kV/50 ns Pulsed Power Switch Based on SiC-JFET Super Cascode" by Biela et al., directs to super cascode architecture of SiC-JFET transistors with auxiliary elements, which statically and dynamically balance the voltage drops across the transistors. Gates of two adjacent transistors in the cascode are connected via a Si-diode where the anode of the diode is connected to the gate of the one transistor and the cathode is connected to the gate of the next transistor in the cascode. For a controlling the static voltage distribution across the transistor, a certain leakage current through the diodes is required. In order to guarantee this leakage current independently of the JFET parameters, resistors are connected between the gate and the source of each transistor. Thus, the leakage current is mainly defined by the resistance value and the JFET's pinch off voltage, which is equal to the voltage drop across the resistor in the off-state. To dynamically balance the voltage across the transistors and in order to avoid over-voltages and achieve synchronization of the JFETs during the switching transients, a capacitor in series with a resistor are connected in parallel with the diode.

SUMMARY OF THE PRESENT DISCLOSED TECHNIQUE

It is an object of the disclosed technique to provide a novel device for switching a high-voltage source, including a plurality of switching devices, a voltage limiter, and a switching time synchronizer. The switching devices are coupled in series starting from a first switching device and ending in a last switching device. The device enables coupling of the high-voltage source with at least a selected one of the switching devices. The voltage limiter is coupled with the switching devices. The first switching device is configured to directly receive a control signal for changing a switching state of the device. The first switching device is configured to facilitate a cascaded transition of switching states in successive switching devices in the series, where the switching time synchronizer is configured to synchronize a time at which transitions to the switching states of successive switching devices take effect. The voltage limiter is configured to limit overvoltage conditions to the switching devices during the transitions.

BRIEF DESCRIPTION OF THE DRAWINGS

The disclosed technique will be understood and appreciated more fully from the following detailed description taken in conjunction with the drawings in which.

DETAILED DESCRIPTION OF THE EMBODIMENTS

Figure 1:
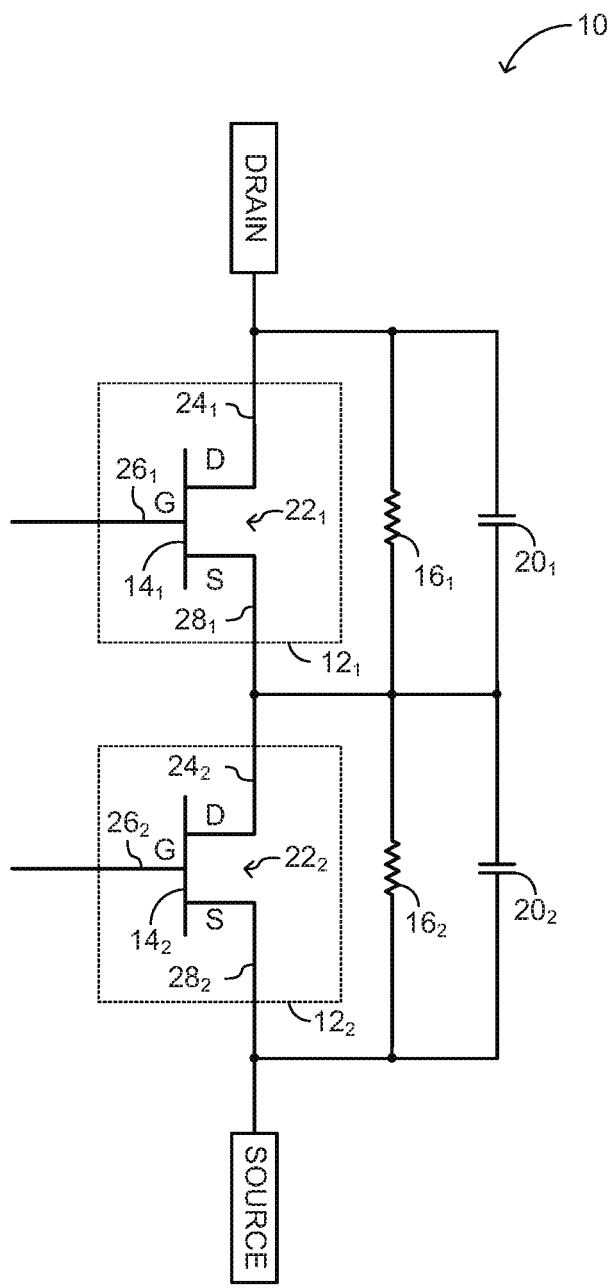
FIG. 1 is a schematic illustration of an exemplary high-voltage semiconductor switching device, which is known in the art.

The disclosed technique overcomes the disadvantages of the prior art by providing devices for switching high-voltages (typically >1 kV) at ultra-fast times (i.e., approximately in the order of ten nanoseconds) such to minimize switching transients (i.e., dynamic transitions between 'ON' and 'OFF' states), thus reducing energy losses associated with longer switching times. For example, prior art high-voltage switching devices connected in series typically use a "classical cascode configuration" in which an initial or first switching transistor (e.g., a metal-oxide-semiconductor field-effect transistor (MOSFET) different from the other switching devices in the series) is connected (i.e., via its drain terminal) to its succeeding switching transistor (i.e., to its source terminal) whose gate is grounded. The MOSFET participates in the switching of a high-voltage source, and is used for modulation. The disclosed technique employs a plurality of switching devices (e.g., transistors) coupled in a series configuration (not a classical cascade configuration) in which the first switching device in the series is configured to be directly modulated (e.g., by a triggering signal) and is not different than the rest of the switching devices in the series. The direct modulation takes advantage of the characteristic fast-switching times of the switching devices. In addition, the disclosed technique includes a switching time synchronizer and a voltage limiter. The switching time synchronizer, which in itself incorporates a switching device (e.g., a normally-off transistor exhibiting minimal energy switching loss), is configured and operative to synchronize the switching times of the switching devices thereby minimizing switching time transitions, energy losses (e.g., resistive, capacitance, etc.), as well as the possibility of uneven voltage sharing among the switching devices during switching transitions. The voltage limiter is configured and operative to suppress and clamp the development of overvoltages that exceed the respective breakdown voltages of the switching devices, especially during switching transitions, thus protecting the switching devices themselves from damage. Furthermore, the high-voltage switching devices of the disclosed technique are further configured and operative to distribute the switching voltage (i.e., the applied high-voltage source) substantially equally among the discrete switching devices thereby achieving a voltage-balanced circuit (e.g., providing about N-times the blocking voltage evenly among N-times the number of switching devices). In other words, the voltage drop of the applied high-voltage source across the entire cascaded series of switching devices is distributed equally among the respective voltage drops of each individual switching device. Additionally, in contrast to the prior art "classical cascode configuration" where transitions between switching states of the transistors in the cascode configuration occur consecutively (i.e., non-simultaneously, exhibiting a time delay/lag/lead), the disclosed technique is configured and operative to synchronize the switching transitions of the serially-cascaded switching devices so as to occur substantially simultaneously (i.e., on the order of several nanoseconds, in effect, reducing energy losses associated with relatively longer switching times).

Figure 2A:
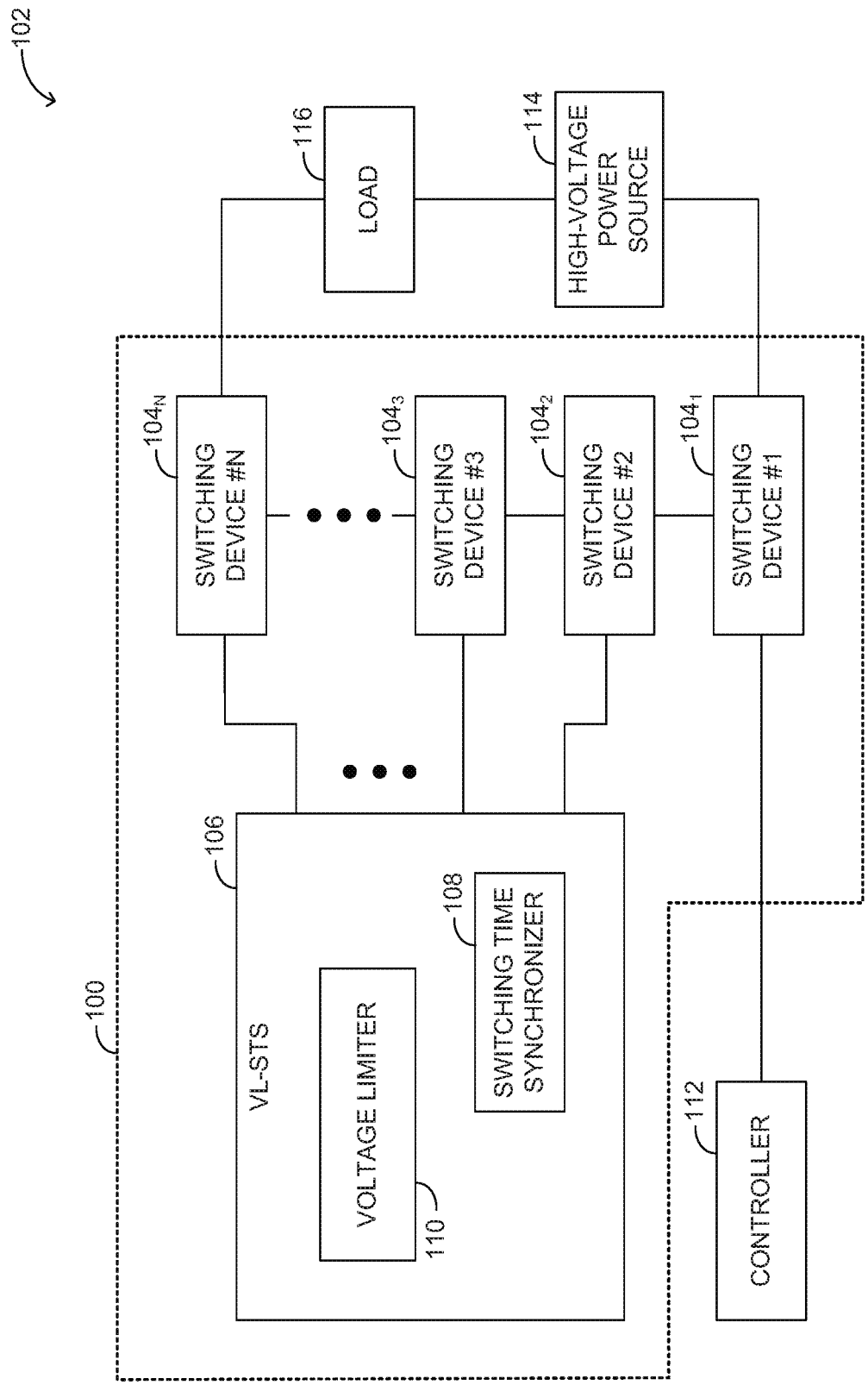
FIG. 2A is a schematic block diagram of a high-voltage switching device, constructed and operative with an embodiment of the disclosed technique.

Reference is now made to FIG. 2A, which is a schematic block diagram of a high-voltage switching device, generally referenced 100, constructed and operative with an embodiment of the disclosed technique. High-voltage switching device 100 includes a plurality of switching devices $104_1$, $104_2$, $104_3$, . . . , $104_N$ (where N≥2 is a positive integer), and a voltage limiter and switching time synchronizer (VL-STS) 106. VL-STS 106 includes a switching time synchronizer 108 and a voltage limiter 110. High-voltage switching device 100 is configured and operative to be coupled with peripheral devices, which typically include a controller 112, and a high-voltage power source 114 that powers an electrical load 116. High-voltage switching device 100 along with the peripheral devices are collectively referenced 102 in FIG. 2A.

Switching devices $104_1$, $104_2$, $104_3$, . . . , $104_N$ are coupled in a sequential series configuration (e.g., a cascade), such that a first switching device in the series, namely, switching device $104_1$, is coupled with a second switching device in the series, namely, switching device $104_2$, which in turn, is coupled with a third switching device in the series, namely, switching device $104_3$, and so forth to a last switching device (N-th) in the series, namely, switching device $104_N$, as shown in FIG. 2A. VL-STS 106 is coupled with switching devices $104_2$, $104_3$, . . . , $104_N$ (i.e., not coupled with switching device $104_1$ as shown in FIG. 2A). Switching device $104_1$ is configured and operative to be coupled with controller 112. Controller 112 is configured and operative to trigger the operation of high-voltage switching device 100 between different controlled switching states. Generally, the term 'switching state' is a state that defines a particular mode of operation of high-voltage switching device 100 in relation to switching. For example, in a simple case high-voltage switching device 100 includes two stable switching states (e.g., 'ON' and 'OFF') and an intermediate momentary transition state between the two stable switching states. In a more general example, high-voltage switching device 100 may include many stable switching states and corresponding intermediate momentary transition states therebetween. High-voltage switching device 100 in turn, is configured and operative to switch between connection (i.e., a closed-circuit) and disconnection (i.e., an open-circuit) of high-voltage power source 114 from powering load 116. Particularly, the combined action of the series of switching devices is configured and operative to switch high-voltage power source 114 whose voltage is higher than voltage sustaining ability (e.g., blocking voltage) of each individual switching device separately (i.e., the blocking voltage of each individual switching device is lower than the voltage of high-voltage source 114 that is applied (i.e., the "applied voltage") to high-voltage switching device 100).

To switch between different controlled switching states of high-voltage switching device 100, controller 112 is configured to generate a control signal (not shown) (e.g., a pulse, a pulse-width modulation (PWM) signal, a specific waveform, a voltage, a current of particular value, and the like), which in turn is received by the first switching device (i.e., switching device $104_1$) in the series of switching devices. The control signal is configured and operative to change the current switching state (e.g., enable, disable) of switching device $104_1$ (e.g., from 'OFF' to 'ON', or vice-versa). Once switching device $104_1$ receives the control signal, it is configured and operative to cause a change in the current switching state of its successively connected switching device in the series, namely, switching device $104_2$, which in turn is configured and operative to cause a change in the current switching state of its successively connected switching device, namely, switching device $104_3$, and so forth in a cascaded manner up to the last switching device in the series, namely, switching device $104_N$. VL-STS 106 and particularly its switching time synchronizer 108 is configured and operative to synchronize the time at which switching devices $104_1$, $104_2$, $104_3$, . . . , $104_N$ change switching states, and concurrently minimizing the transition time, thus reducing potential energy losses associated with longer transition time. Switching time synchronizer 108 is typically embodied as an electronic timing mechanism, for example a time controlling circuit (or plurality thereof associated with each switching device), a discrete time controlling device (or plurality thereof), and the like.

VL-STS 106 in general and voltage limiter 110 in particular is configured to limit over voltage conditions to the switching devices, including the limiting and suppressing of possible occurrences of voltage transients in the switching process including the clamping (i.e., limiting, constraining) the possibility of developing overvoltages that may exceed the respective maximum operating voltage (e.g., breakdown voltage or blocking voltage) of the switching devices in the switching process. Voltage limiter 110 is further configured and operative to enable an even distribution of the source voltage between switching devices $104_1$, $104_2$, $104_3$, . . . , $104_N$. Essentially, in a preferred implementation the high-voltage power source's voltage is sustained and distributed substantially equally among switching devices $104_1$, $104_2$, $104_3$, . . . , $104_N$. Alternatively, according to another implementation, the high-voltage power source's voltage is distributed non-uniformly among switching devices $104_1$, $104_2$, $104_3$, . . . , $104_N$ as long as the maximum operating voltages (e.g., breakdown voltages) is not exceed for each switching device. In other words, voltage limiter 110 is configured to limit the voltage drop on each one of the switching devices to be below its respective breakdown voltage. Switching devices $104_1$, $104_2$, $104_3$, ..., $104_N$ are typically embodied in the form of fast-switching transistors, as will be described in greater detail in the following example implementations.

Figure 2B:
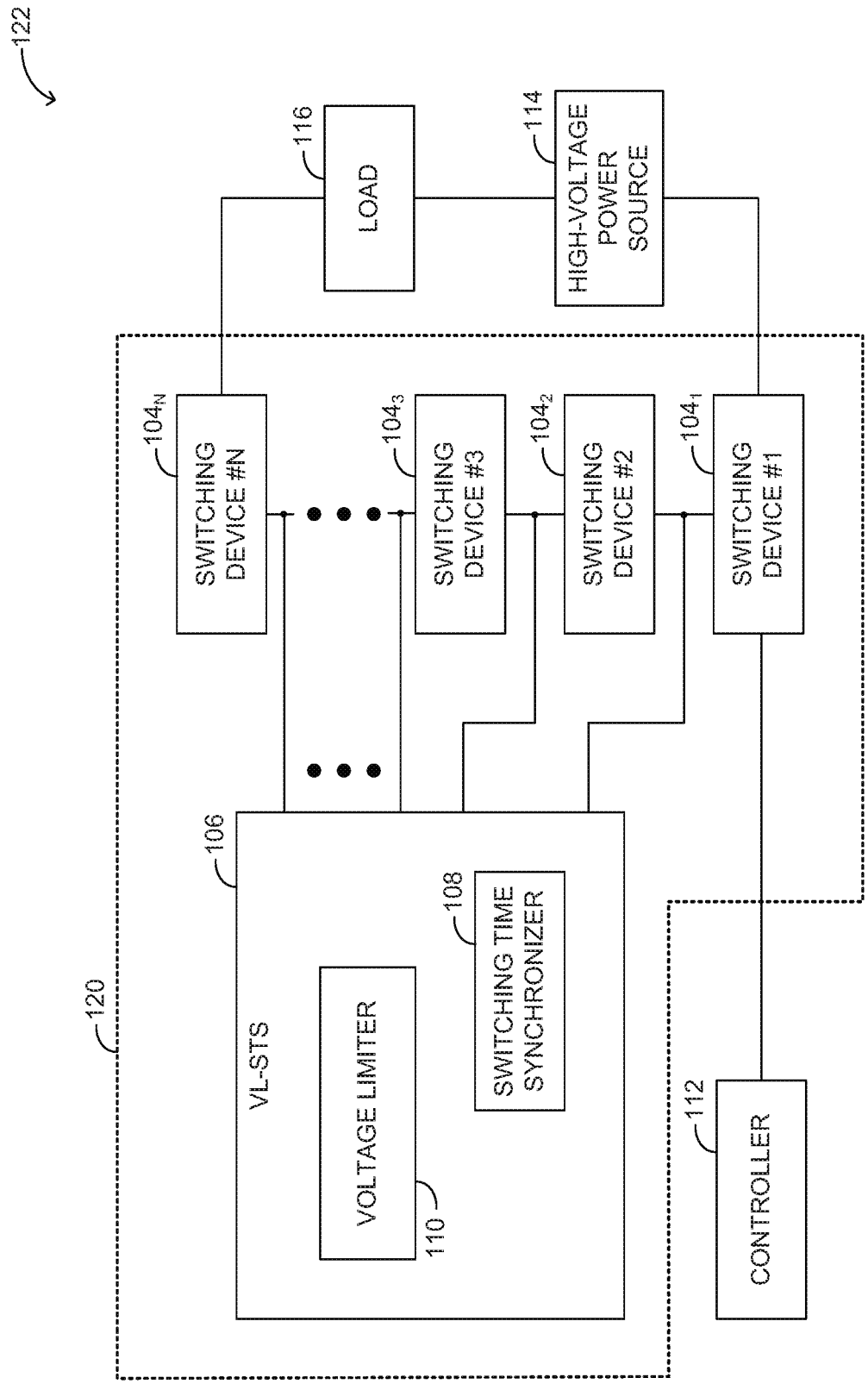
FIG. 2B is a schematic block diagram of another configuration of high-voltage switching device, constructed and operative in accordance with the embodiment of the disclosed technique.

High-voltage switching device 100 shown in FIG. 2A may have alternative configurations that accord with the principles of with the disclosed technique. Reference is now further made to FIG. 2B, which is a schematic block diagram of another configuration of high-voltage switching device, generally referenced 120, constructed and operative in accordance with the embodiment of the disclosed technique. FIG. 2B shows a high-voltage switching device 120, which is similar to high-voltage switching device 100 of FIG. 2A. High-voltage switching device 120 along with the peripheral devices are collectively referenced 122 in FIG. 2B. The same numbered components shown in FIG. 2B as in FIG. 2A are identical and have the same function. The configuration shown in FIG. 2B differs from that shown in FIG. 2A in that VL-STS 106 is coupled with switching devices $104_1$, $104_2$, $104_3$, ..., $104_N$ at the coupling point between two successive switching devices. Specifically, VL-STS 106 is coupled with switching devices $104_1$ and $104_2$ at their mutual connection point, with switching devices $104_2$ and $104_3$ at their mutual connection point, and likewise so forth to switching devices $104_{N-1}$ and $104_N$. Voltage limiter 110 is configured to limit and suppress the transpiration of overvoltages that may damage the individual switching devices during the switching process, and to allow and maintain an even distribution of the high-voltage power source 114 between the switching devices. Switching time synchronizer 108 is configured to synchronize a time at which transitions to the switching states of successive switching devices take effect. According to one implementation, switching time synchronizer 108 is configured and operative to couple with switching devices $104_2$, $104_3$, ..., $104_N$ and to time-wise synchronize the triggering of transitions to the switching states of the switching devices. According to another implementation, switching time synchronizer 108 is configured and operative to generate at least one reference time signal that enables time-synchronization of the switching states of the switching devices (i.e., the triggering of transitions to their switching states).

Figure 2C:
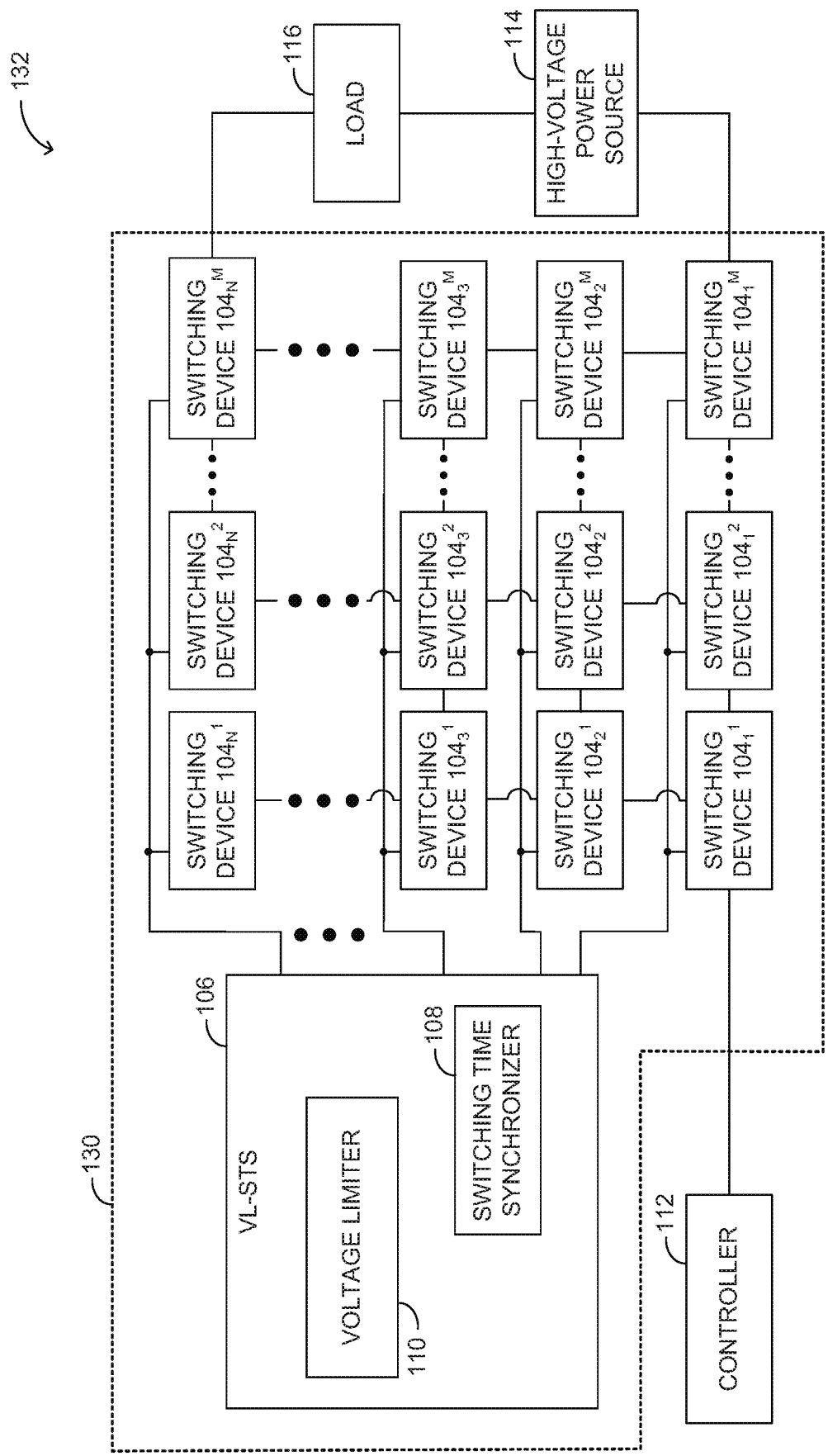
FIG. 2C is a schematic block diagram of further configuration of high-voltage switching device, constructed and operative in accordance with the embodiment of the disclosed technique.

Reference is now further made to FIG. 2C, which is a schematic block diagram of further configuration of high-voltage switching device, generally referenced 130, constructed and operative in accordance with the embodiment of the disclosed technique. FIG. 2C illustrates a high-voltage switching device 130, which is similar to high-voltage switching devices 100 (FIG. 2A) and 120 (FIG. 2B). High-voltage switching device 130 along with the peripheral devices are collectively referenced 132 in FIG. 2C. The same numbered components shown in FIG. 2B as in FIG. 2A are identical and have the same function. The configuration of high-voltage switching device 130 generally includes N rows times M columns (N×M) of switching devices (where M is a positive integer). The subscript index of reference number 104 represents the row (ranging between 1 through N), while the superscript index represents the column (ranging between 1 through M). Switching devices in same row are coupled to each other in parallel (i.e., denoted interchangeably herein as "parallel switching devices", and parallel-connected switching devices", and "parallel-coupled switching devices"), while switching devices in the same column are coupled to each other in series. For example switching device $104_1^1$ is coupled in parallel with switching device $104_1^2$ (i.e., sharing the same row number 1), and also coupled in series with switching device $104_2^1$ (i.e., sharing the same column number 1). The configuration of the switching devices in high-power switching device 130 is configured and operative to be utilized in cases where a relatively high current is required to be switched (i.e., higher than can be sustained by a single switching device in each row, as shown for example in the configurations of FIGS. 2A and 2B). The configuration shown in FIG. 2C enables a high current flow to be split among each of the parallel-coupled switching devices. For the sake of simplicity FIG. 2C illustrates a special case where there are M switching devices in each row; however, the disclosed technique is compatible with a more general arrangement of each row (1 through N) having a respective variable number $M_1$, $M_2$, $M_3$, ... $M_N$ of switching devices coupled in parallel. FIGS. 2A and 2B show a simple case of one switching device per row (i.e., M=1), typically employed for relatively low currents (i.e., in which each switching device is able to sustain current flow therethrough).

Figure 9:
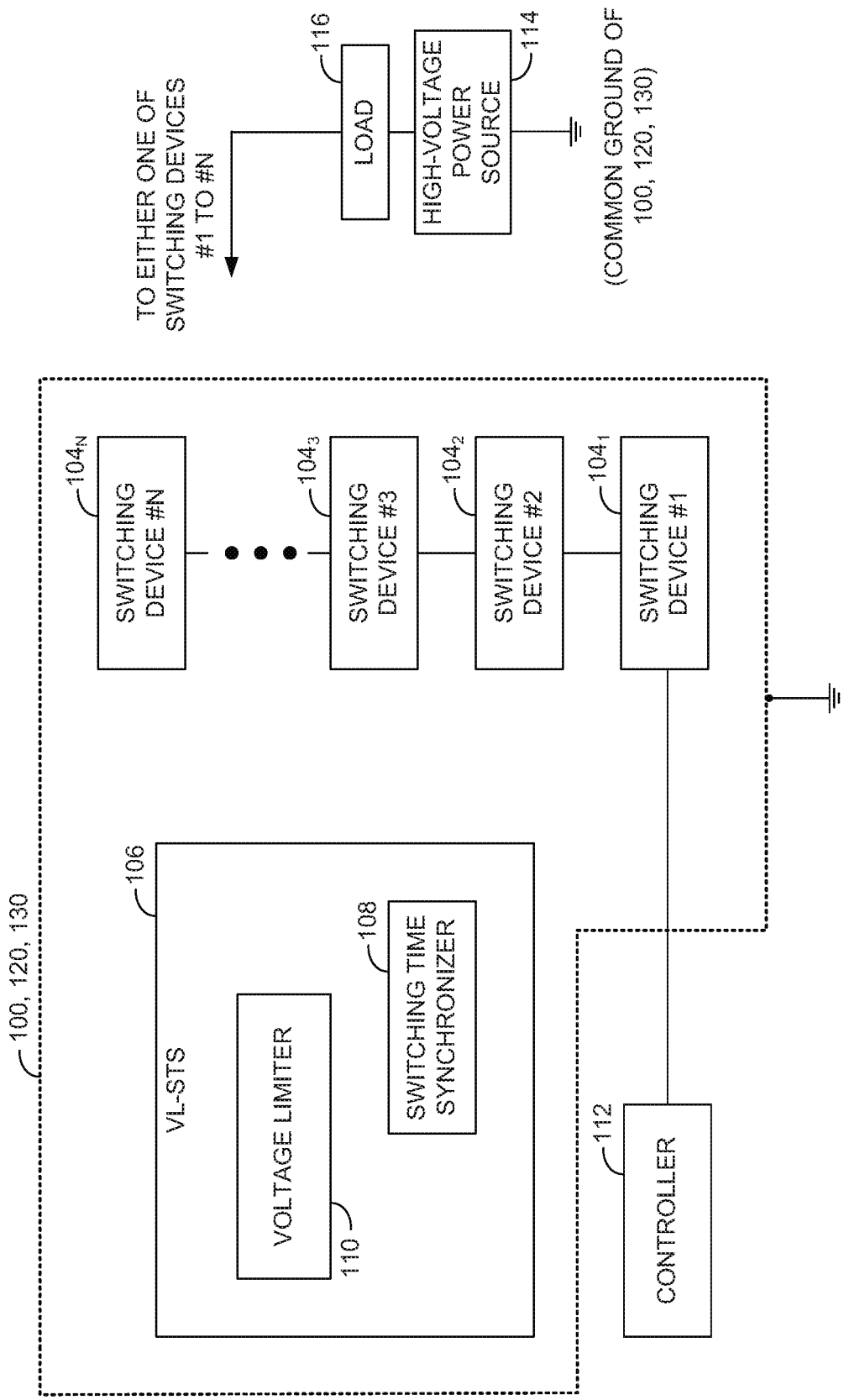
FIG. 9 is a schematic block diagram of the high-voltage switching devices of FIGS. 2A-2C, showing another coupling configuration between high-voltage switching devices with a high-voltage power source and load, constructed and operative in accordance with the disclosed technique.

FIGS. 2A, 2B, and 2C show only a particular example coupling configuration between high-voltage switching device 100 with high-voltage power source 114 and load 116 for the purpose of explicating the particulars of the disclosed technique. In the following description there will be shown other possible coupling configurations (FIG. 9).

Figure 3A:
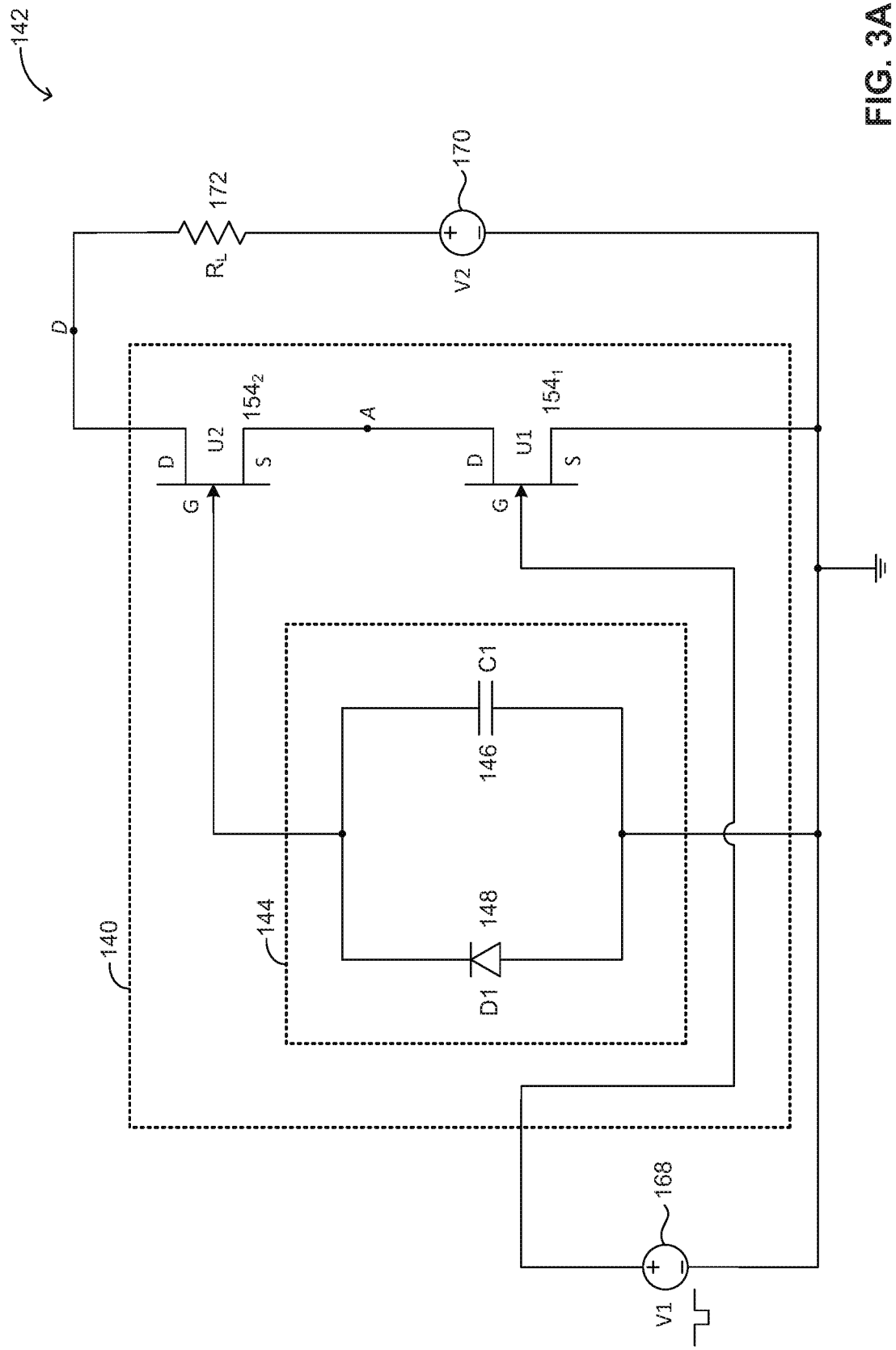
FIG. 3A is a schematic illustration of a particular basic implementation of the high-voltage switching device 120 in FIG. 2B, generally referenced 140, constructed and operative in accordance with the embodiment of the disclosed technique.
Figure 3B:
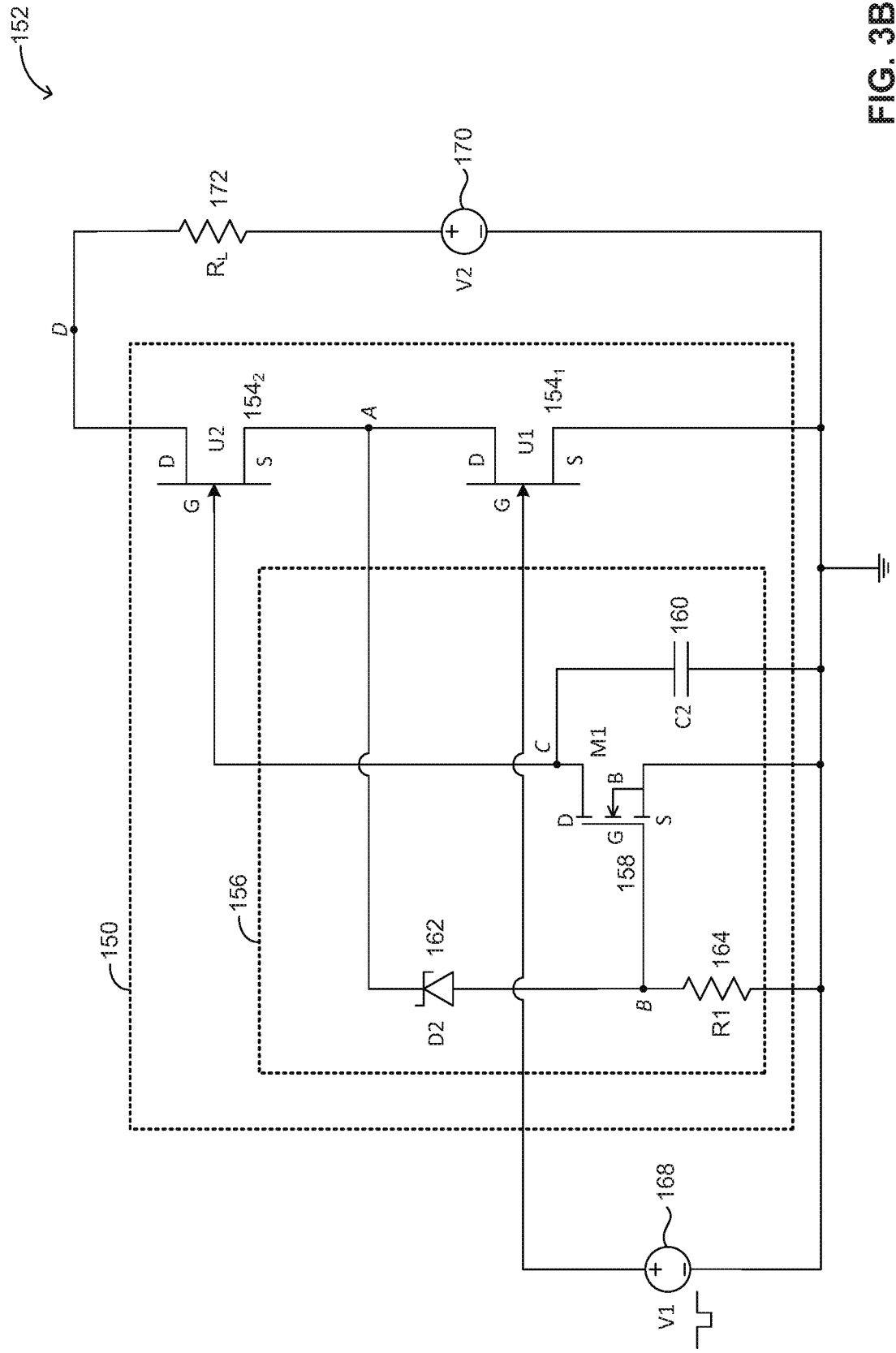
FIG. 3B is a schematic illustration of a particular implementation of the high-voltage switching device in FIG. 2B, constructed and operative in accordance with the embodiment of the disclosed technique.
Figure 4:
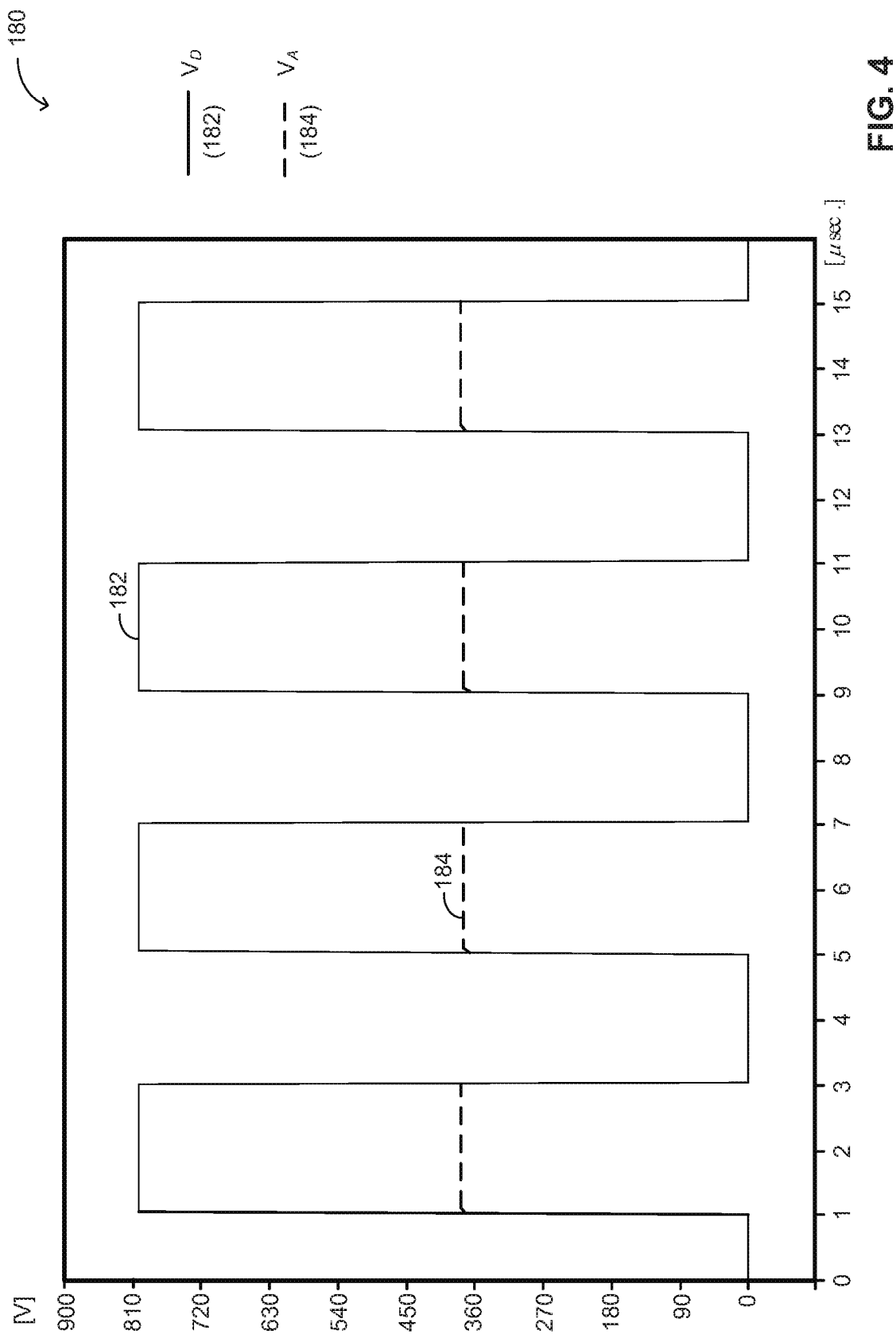
FIG. 4 is a plot showing a typical switching time characteristic, of the high-voltage switching device.

Reference is now made to FIGS. 3A, 3B, and 4. FIG. 3A is a schematic illustration of a particular basic implementation of the high-voltage switching device 120 in FIG. 2B, generally referenced 140, constructed and operative in accordance with the embodiment of the disclosed technique. FIG. 3B is a schematic illustration of a particular implementation of the high-voltage switching device 120 in FIG. 2B, generally referenced 150, constructed and operative in accordance with the embodiment of the disclosed technique. FIG. 4 is a plot showing a typical switching time characteristic, generally referenced 180, of the high-voltage switching device.

With reference to FIG. 3A, high-voltage device 140 includes two switching devices embodied as transistors $154_1$ ("U1"), $154_2$ ("U2"), as well as a voltage limiter and switching time synchronizer (VL-STS) 144, which in turn is implemented via a plurality of discrete devices. Specifically, VL-STS 144 includes a capacitor 146 ("C1"), and a reverse-biased diode 148 ("D1"). High-voltage switching device 140 is configured and operative to be coupled with peripheral devices, which typically include a controller 168 ("V1"), a high-voltage power source 170 (V2) that drives for example, an electrical load 172 ("$R_L$"). High-voltage switching device 140 along with the peripheral devices are collectively referenced 142 in FIG. 3A. Each one of transistor $154_1$ and transistor $154_2$ includes three terminals, namely, a gate (G), a source (S), and a drain (D). Transistors $154_1$ and $154_2$ are generally termed herein simply as "transistors", and particularly are usually embodied as (depletion-mode) normally-ON field-effect transistors (FETs), junction gate field-effect transistors (JFETs) (as shown in FIGS. 3A and 3B), GaN high electron mobility transistor (HEMT) transistors, and the like. Transistors $154_1$ and $154_2$ are coupled in a series configuration, where a source terminal of transistor $154_2$ is connected to a drain terminal of transistor $154_1$, where the (source-drain) point of interconnection is denoted point 'A'. (Note that all reference points relating to the circuit shown in FIGS. 3A and 3B are inscribed in italics.) Transistor $154_1$ is in a common source configuration in which its source terminal is grounded. Transistors $154_1$ and $154_2$ are also respectively termed herein as "first transistor" and "second transistor". For elucidating the disclosed technique only two transistors are shown, however, without loss of generality, the principles of the disclosed technique likewise apply generally to N≥2 transistors. In the two-transistor configuration shown in FIGS. 3A and 3B, the second transistor (i.e., transistor $154_2$) is also termed the "last transistor", or generally as the "N-th transistor" in the series (of generally N transistors).

Diode 148 and capacitor 146 are connected in parallel such that one branch of this parallel coupling is coupled with the gate terminal of transistor $154_2$ while the other branch is grounded. Specifically, a cathode terminal of diode 148 is coupled with the gate terminal of transistor $154_2$, while an anode terminal of diode 148 is connected to the source terminal of transistor $154_1$ (i.e., a lower numbered transistor in the series). FIG. 3A shows a typical implementation of high-voltage switching device 140 in which transistors $154_1$ and $154_2$ are selected to be (depletion-mode) normally 'ON' (i.e., conductive between drain and source terminals) JFETs.

In an initial state, high-voltage power source 170 is applied to high-voltage switching device 140 at point 'D' (via electrical load 172), as shown in FIG. 3A. Transistors $154_1$ and $154_2$ are conductive between their respective drain and source terminals, and the voltage at point 'A' with respect to the ground is zero. In this initial state, the potential difference between gate and source terminals of transistor $154_2$ is zero, i.e., $v_{gs}(U2) \cong 0$). To turn high-voltage switching device 140 to an 'OFF' state, controller 168 is configured and operative to control the switching state of high-voltage switching device 140 by generating a control signal (e.g., a reverse bias voltage waveform (e.g., a pulse) whose voltage is at least equal to or negatively exceeds the pinch-off voltage $V_P$ (U1) of transistor $154_1$ (i.e., substantially for the duration of the pulse)). At the pinched-off state, the channel is depleted from mobile carriers, thus becoming nonconductive and transistor $154_1$ is switched off, causing the potential difference at point 'A' with respect to the ground to rise from zero toward the voltage V2. Since transistor $154_2$ is configured such that its gate follows its source, this in turn causes the voltage at its gate to rise while capacitor 146 charges. Capacitor 146 is thus configured and operative to remove or at least reduce the time lag between the gate-to-source following mechanism. When the rising potential difference between the gate and source of transistor $154_2$ reaches the pinch-off voltage $V_P$ (U2), transistor $154_2$ switches off (i.e., becomes nonconductive between source and drain). Concomitantly, the voltage rise at point 'A' is limited by the voltage drop on diode 148, which is generally selected to be a reverse-biased diode (e.g., a Zener diode, a transient-voltage-suppressor (TVS) such as a transient-voltage-suppression (TVS) diode, etc.). The diode's 148 voltage rating (i.e., reverse breakdown voltage) is selected such that its action effectively maintains the voltage at point 'A' to be below the breakdown voltage of transistor $154_1$ (i.e., thereby providing overvoltage protection to transistor $154_1$). Diode 148 is therefore configured and operative as a voltage limiter of VL-STS 144; and capacitor 146 is configured and operative as a switching time synchronizer of VL-STS 144 (i.e., for time-synchronizing the switching states of transistors $154_1$ and $154_2$).

To turn high-voltage switching device 140 to an 'ON' state, controller 168 is configured and operative to generate a control signal (or alternatively, to turn off, be cut off, etc.) such by inducing a potential difference between the gate and source terminals of transistor $154_1$ that is below the pinch-off voltage (e.g., $v_{gs}(U1)=0$). Consequently, transistor $154_1$ becomes conductive and its drain terminal becomes grounded, along with the voltage at point A, which in turn decreases below the voltage drop on diode 148 causing diode 148 to shut off. The decreasing voltage on transistor's $154_2$ source is followed by a corresponding voltage decrease on its gate that effectively discharges via capacitor 146.

Consequently, according to a general case of the basic configuration of high-switching device 140 of FIG. 3A, where there are N>2 switching devices (e.g., transistors $154_1$, $154_2$, . . . , $154_N$ (N>2 not shown)), there are N–1 voltage limiters (e.g., reverse-biased diodes) and N–1 switching time synchronizers (e.g., capacitors) each respectively coupled at one of their ends to N–1 gate terminals (e.g., from the second transistor to the last transistor $154_2$, . . . , $154_N$, respectively), and at the other one of their ends are connected to a previous source terminal of a sequentially lower numbered (index) transistor. For example, for N=3 (not shown) there are two voltage limiters and two switching time synchronizers, where the first voltage limiter and first switching time synchronizer are connected at one of their ends to the gate terminal of the second switching device (e.g., transistor $154_2$), while the other one of their ends are connected to the gate terminal of the first switching device (e.g., transistor $154_1$). The second voltage limiter and the second switching time synchronizer are connected at one of their ends to the gate terminal of the third switching device (e.g., transistor $154_3$—not shown), while the other one of their ends is connected to the gate terminal of the second switching device (e.g., transistor $154_2$—i.e., whose index (2) is sequentially lower numbered than transistor $154_3$ (3)). Alternatively, the voltage limiters and switching time synchronizers are each respectively coupled at one of their ends to a respective gate terminal of a switching device, while the one of their ends are grounded.

With reference to FIG. 3B, high-voltage device 150 includes two switching devices embodied as transistors $154_1$ ("U1"), $154_2$ ("U2"), as well as a voltage limiter and switching time synchronizer (VL-STS) 156, which in turn is implemented via a plurality of discrete devices. Specifically, VL-STS 156 includes a transistor 158 ("M1"), a Zener diode 162 ("D2"), a capacitor 160 ("C2"), and a resistor 164 ("R1"). (Zener diode 162 may generally be implemented by a reverse-biased diode, TVS, and the like.) High-voltage switching device 150 is configured and operative to be coupled with peripheral devices, which typically include a controller 168 ("V1"), a high-voltage power source 170 (V2) that drives an electrical load 172 ("$R_L$"). High-voltage switching device 150 along with the peripheral devices are collectively referenced 152 in FIGS. 3A and 3B. Each one of transistor $154_1$ and transistor $154_2$ includes three terminals, namely, a gate (G), a source (S), and a drain (D). Transistor 158 generally includes in addition to the three terminals a gate (G), a source (S), and a drain (D), also a body (B) terminal. Transistors $154_1$ and $154_2$ are typically embodied as normally-ON field-effect transistors (FETs), junction gate field-effect transistors (JFETs), GaN high electron mobility transistor (HEMT) transistors, and the like. Similarly, transistor 158 is generally termed "transistor" as well, and is typically embodied as a metal-oxide-semiconductor field-effect transistor (MOSFET), bipolar junction transistor (BJT), and the like. Transistors $154_1$ and $154_2$ are typically chosen to be of gallium nitride (GaN) type, owing to their high-voltage switching capability (e.g., hundreds of volts) in ultrafast times (e.g., nanoseconds). Besides the intrinsic advantages afforded by GaN such as exhibiting a low temperature coefficient, GaN transistors further exhibit extremely low gate-drain capacitance, outstandingly low total gate charge, as well as zero source-drain recovery charge.

Similarly to FIG. 3A, transistors $154_1$ and $154_2$ are coupled in a series configuration, where the source terminal of transistor $154_2$ is connected to the drain terminal of transistor $154_1$. Transistor $154_1$ is in a common source configuration in which its source terminal is grounded. A cathode terminal of Zener diode 162 is coupled with the aforementioned source-drain interconnection between transistors $154_1$ and $154_2$ at point 'A' (i.e., the source terminal of transistor $154_1$ and the drain terminal of transistor $154_2$), while the anode terminal of Zener diode 162 is coupled in series with one terminal of resistor 164 at point 'B' and whose other terminal is grounded. Thus, one branch of the series-connected Zener diode 162 and resistor 164 is connected to a coupling point between two successive said switching devices (i.e., point 'A'), while the other branch is connected to the gate terminal of transistor $154_1$. Alternatively, for a general cascade of N>2 switching devices (not shown in FIG. 3B), the other branch of each N−1 series-connected Zener diode and resistor is grounded. The gate terminal of transistor 158 is coupled with the anode terminal of Zener diode 162 and resistor 164 at point 'B'. The source and (optionally body) terminal(s) of transistor 158 are grounded, while its drain terminal is coupled with both the gate germinal of transistor $154_1$ and one terminal of capacitor 160. The other terminal of capacitor 160 is grounded. Capacitor 160 is thus connected between the drain and source terminals of switching transistor 158. FIG. 3B illustrates a typical implementation of high-voltage switching device 150, where transistors $154_1$ and $154_2$ are selected as JFET, and transistor 158 is selected as n-type MOSFET. Furthermore, in this configuration, transistors $154_1$ and $154_2$ are normally 'ON' (i.e., conductive between drain and source terminals), and transistor 158 is normally 'OFF' (i.e., nonconductive between drain and source terminals). Although only two series-connected switching transistors ($154_1$ and $154_2$) are shown in FIG. 3B, the circuit configuration of high-voltage switching device 150 can be generalized to more than two series-connected switching transistors, according the principles of the disclosed technique.

In an initial state, transistors $154_1$ and $154_2$ are conductive between their respective drain and source terminals, and the voltage at point 'A' with respect to the ground is zero. In this initial state, the potential difference between gate and source terminals of transistor $154_2$ is zero, i.e., $v_{gs}(U2)=0$). FIG. 4 illustrates graphs 182 and 184, which plot the voltages of points D (i.e., $V_D$) and A (i.e., $V_A$) respectively (with respect to the ground (FIG. 4) as a function of time. In the initial state (time t=0) $V_A \cong V_D \cong 0$, as shown in FIG. 3B.

To turn high-voltage switching device 150 to an 'ON' state, controller 168 is configured and operative to control the switching state of high-voltage switching device 150 at least by causing a potential difference between the gate and source terminals of transistor $154_1$. At a particular time, controller 168 is configured to generate a control signal, for example, a reverse bias voltage waveform (e.g., in the form of a negative voltage pulse for an n-type channel GaN HEMT, whose voltage is at least equal to or negatively exceeds the pinch-off voltage $V_P$ (U1) of transistor $154_1$ (i.e., substantially for the duration of the pulse). At the pinched-off state, the channel is depleted from mobile carriers, thus becoming nonconductive and transistor $154_1$ is switched off (i.e., effectively no current flows between its drain and source terminals). Consequently, the potential difference at point 'A' with respect to the ground starts rising from zero toward the voltage V2. Since transistor $154_2$ is configured such that its gate follows its source, this in turn causes the voltage at its gate to rise while capacitor 160 charges. Capacitor 160 is thus configured and operative to remove or at least reduce the time lag between the gate-to-source following mechanism. When the rising potential difference between the gate and source of transistor $154_2$ reaches the pinch-off voltage $V_P$ (U2), transistor $154_2$ switches off (i.e., becomes nonconductive between source and drain).

Concurrently, the voltage rise at point 'A' is limited by the sum of the Zener voltage of Zener diode 162 and the voltage drop on resistor 164 (i.e., $V_B$). Consequently, a rising voltage drop on resistor 164 induces a potential difference between gate and source terminals of transistor 158 (i.e., $V_{GS}$ (M1)) above its threshold voltage $V_t$(M1), which in turn causes it to switch on (i.e., be conductive between its drain and source terminals). The value of resistor 164 is chosen such that a voltage drop thereon is able to exceed $V_t$(M1). Moreover, the Zener diode's 162 Zener voltage rating and the resistance of resistor 164 are selected such that their combined action effectively maintains the voltage at point 'A' to be below the breakdown voltage of transistor $154_1$ (i.e., thereby providing overvoltage protection to transistor $154_1$). Typically, the value of the Zener diode 162 is chosen to divide the blocking voltage approximately equally between transistors $154_1$ and $154_2$, as will be described in greater detail below. Voltage limiter 110 (FIGS. 2A-2C) of VL-STS 156 (FIG. 3B) is mainly implemented by Zener diode 162 (FIG. 3B). Switching time synchronizer 108 (FIG. 2A) of VL-STS 156 (FIG. 3B) is mainly implemented by capacitor 160 (FIG. 3B).

More generally, according to one implementation transistors $154_1$ and $154_2$ are chosen to have as nearly similar characteristics (e.g., physical characteristics, specifications and ratings defining the transistor parameters). According to such an implementation, the drain-source voltage drop on transistors $154_1$ and $154_2$ is configured to equalize (i.e., balanced, in the switched-off state where each exhibits a very large electrical resistance). For example, if V2=800V, the voltage drop on each transistor $154_1$ and $154_2$ is $V_D$(U1) $\cong V_D$(U2)$\cong$400V (chosen to be below their respective breakdown voltages). According to another implementation, transistors $154_1$ and $154_2$ are configured to have different drain-source voltage drops (e.g., $V_D$(U1)=550V, whereas $V_D$(U2) =650V), assuming the transistors' ability to sustain such high blocking voltages (i.e., the drain-source voltage at which breakdown transpires).

Figure 5:
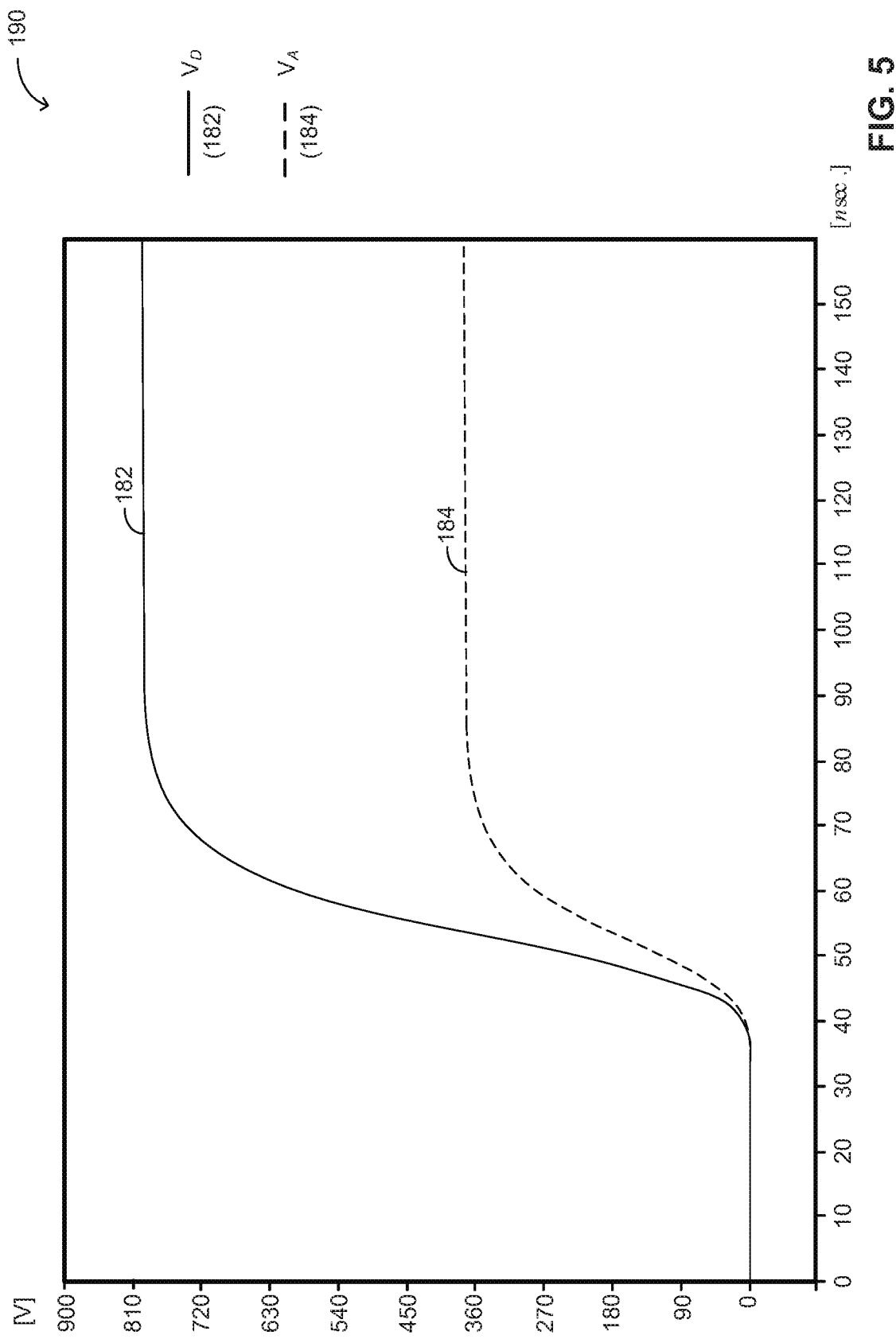
FIG. 5 is a plot showing a detailed view of the rise-times in the switching time characteristics of FIG. 4.

Reference is now made to FIG. 5, which is a plot, generally referenced 190, showing a detailed view of the rise-times in the switching time characteristics of FIG. 4. FIG. 5 shows a detailed, time scale expanded view of the switching time characteristic of FIG. 4 that includes graphs 182 and 184, which plot the voltages of points D (i.e., $V_D$) and A (i.e., $V_A$) respectively (with respect to the ground) as a function of time. As shown in FIG. 5, the voltage rise-times for $V_D$ and $V_A$ transpire approximately simultaneously. Particularly, for $V_A$ the voltage starts to rise from 0 V at approximately 38 ns (nanoseconds) to approximately 370 V at approximately 86 ns (i.e., in 48 ns). Similarly, $V_D$ starts to rise from 0 V at approximately 38 ns to approximately 800 V at approximately 88 ns (i.e., in 50 ns.). The 800 V voltage is effectively sustained by a distributed and substantially balanced voltage drop across transistors $154_1$ and $154_2$. High-voltage switching device 150 achieves a tolerance for synchronization among the discrete switching devices (transistors $154_1$ and $154_2$) of 4 ns.

To turn high-voltage switching device 150 to an 'OFF' state, controller 168 is configured and operative to generate a control signal (or alternatively, to turn off, be cut off, etc.) such by inducing a potential difference between the gate and source terminals of transistor 154₁ that is below the pinch-off voltage (e.g., $v_{gs}(U1)=0$). Consequently, transistor 154₁ becomes conductive (i.e., 'ON' state) and the drain terminal of transistor 154₁ becomes grounded, along with the voltage at point A, which in turn decreases below the Zener voltage drop of Zener diode 162 causing Zener diode 162 to shut off. The decreasing voltage at point B toward zero brings $v_{gs}(M1)$ of transistor 154₂ to correspondingly decrease until transistor 154₂ is turned off (i.e., nonconductive between drain and source terminals).

Concurrently, the decreasing voltage on transistor's 154₂ source is followed by a correspondingly voltage decrease on its gate that effectively discharges via capacitor 160. Capacitor 160 thus reduces the time lag between the gate-to-source following mechanism. As the decreasing potential difference between the gate and source of transistor 154₂ drops below the pinch-off voltage $V_P$ (U2), transistor 154₂ switches on (i.e., becomes conductive between source and drain).

Figure 6:
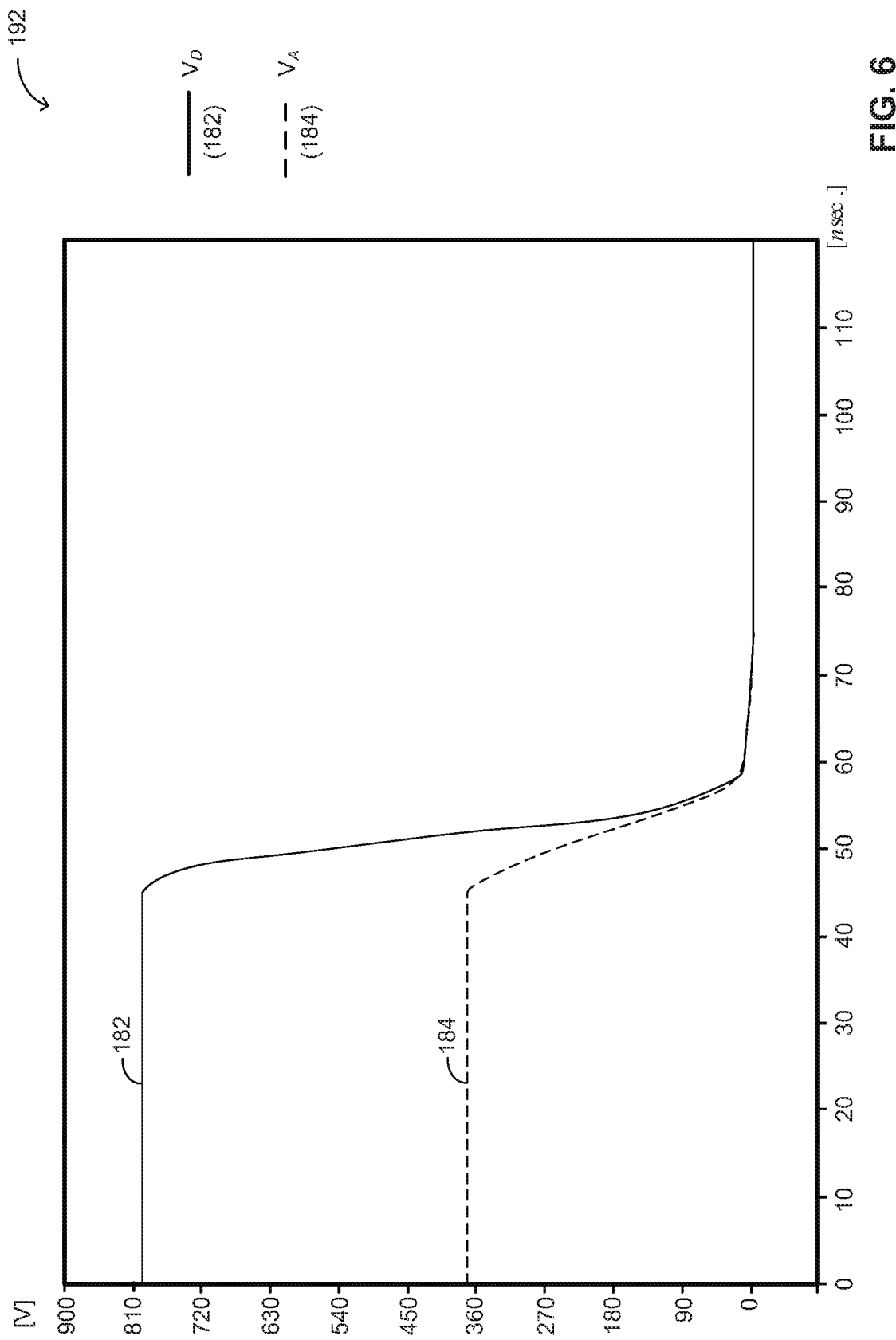
FIG. 6 is a plot showing a detailed view of fall-times in the switching time characteristic of FIG. 4.

Reference is now made to FIG. 6, which is a plot, generally referenced 192, showing a detailed view of the fall-times in the switching time characteristics of FIG. 4. FIG. 6 shows a detailed, time scale expanded view of the switching time characteristic of FIG. 4 that includes graphs 182 and 184, which plot the voltages of points D (i.e., $V_D$) and A (i.e., $V_A$) respectively (with respect to the ground) as a function of time. As shown in FIG. 6, the voltage fall-times for $V_D$ and $V_A$ transpire approximately simultaneously. Particularly, for $V_A$ (denoted by a dashed line) the voltage starts to fall from approximately 370 V at 45 ns (nanoseconds) to approximately 0 V at approximately 75 ns (i.e., in 30 ns). Similarly, $V_D$ (denoted by continuous line) starts to fall from approximately 800 V at 45 ns to 0 V at approximately 75 ns (i.e., in 30 ns.). The 800 V is effectively sustained by a distributed and substantially balanced voltage drop across transistors 154₁ and 154₂.

Figure 7:
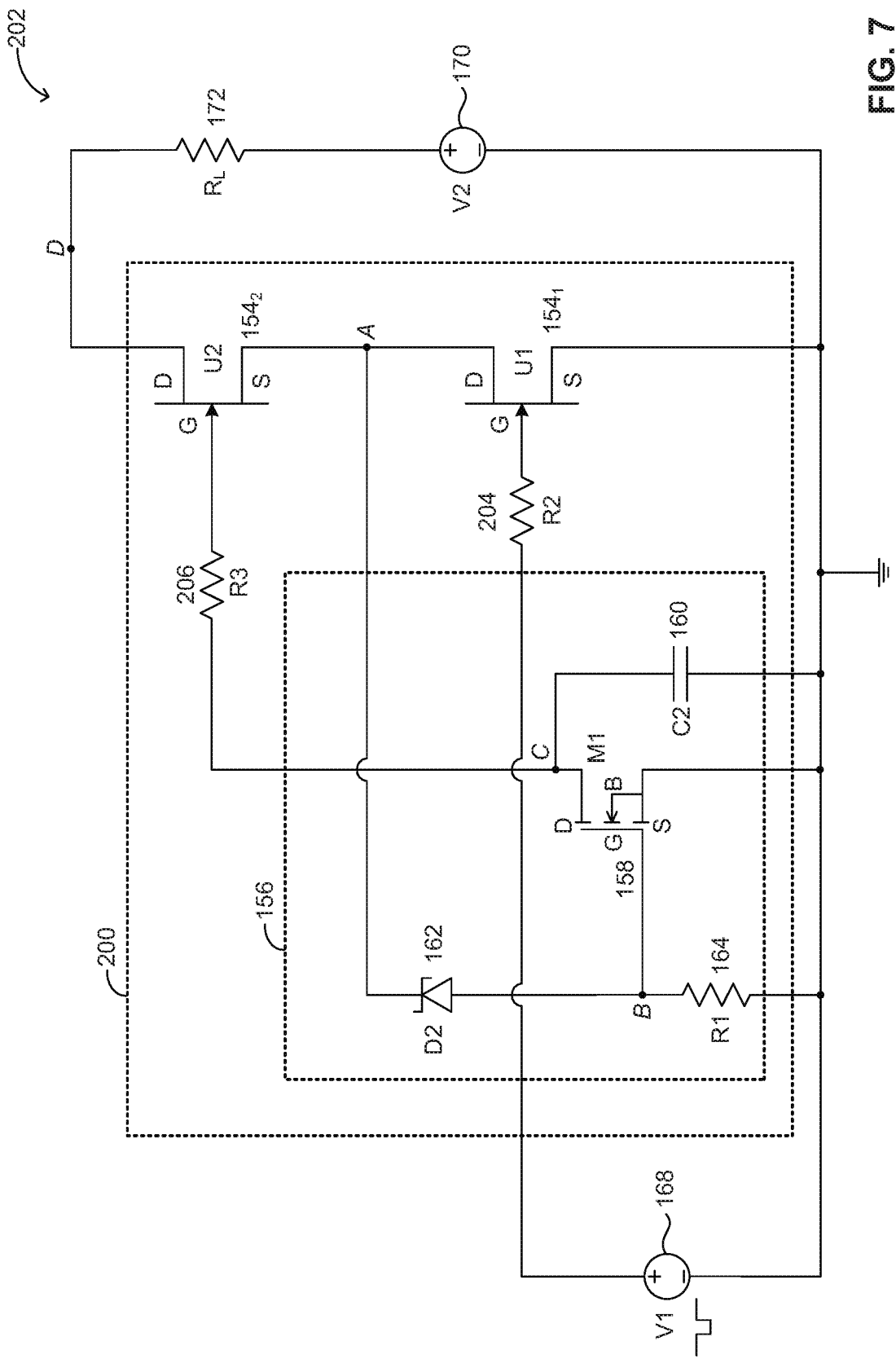
FIG. 7 is a schematic illustration of another implementation of the high-voltage switching device in FIG. 2A.

Reference is now made to FIG. 7, which is a schematic illustration of another implementation of the high-voltage switching device in FIG. 2, generally referenced 200. FIG. 7 shows a high-voltage switching device 200, which is substantially similar in configuration, operation and function to high-voltage switching device 100 of FIG. 3B, apart from added resistors 204 ("R2") and 206 ("R3"), each respectively connected in series to a gate terminal of transistors 154₁, and 154₂. The same numbered components as in FIG. 3B have the same function. Analogously to high-voltage switching device 100 of FIG. 3B, high-voltage switching device 200 is configured and operative to be coupled with peripheral devices (i.e., controller 112, high-voltage power source 114, and load 116). High-voltage switching device 200 along with the peripheral devices are collectively referenced 202 in FIG. 7. Resistors 204 and 206 (also denoted herein as "current-limiting resistors") are each configured and operative to limit the electrical current through the respective gate of transistors 154₁ and 154₂, respectively.

Figure 8:
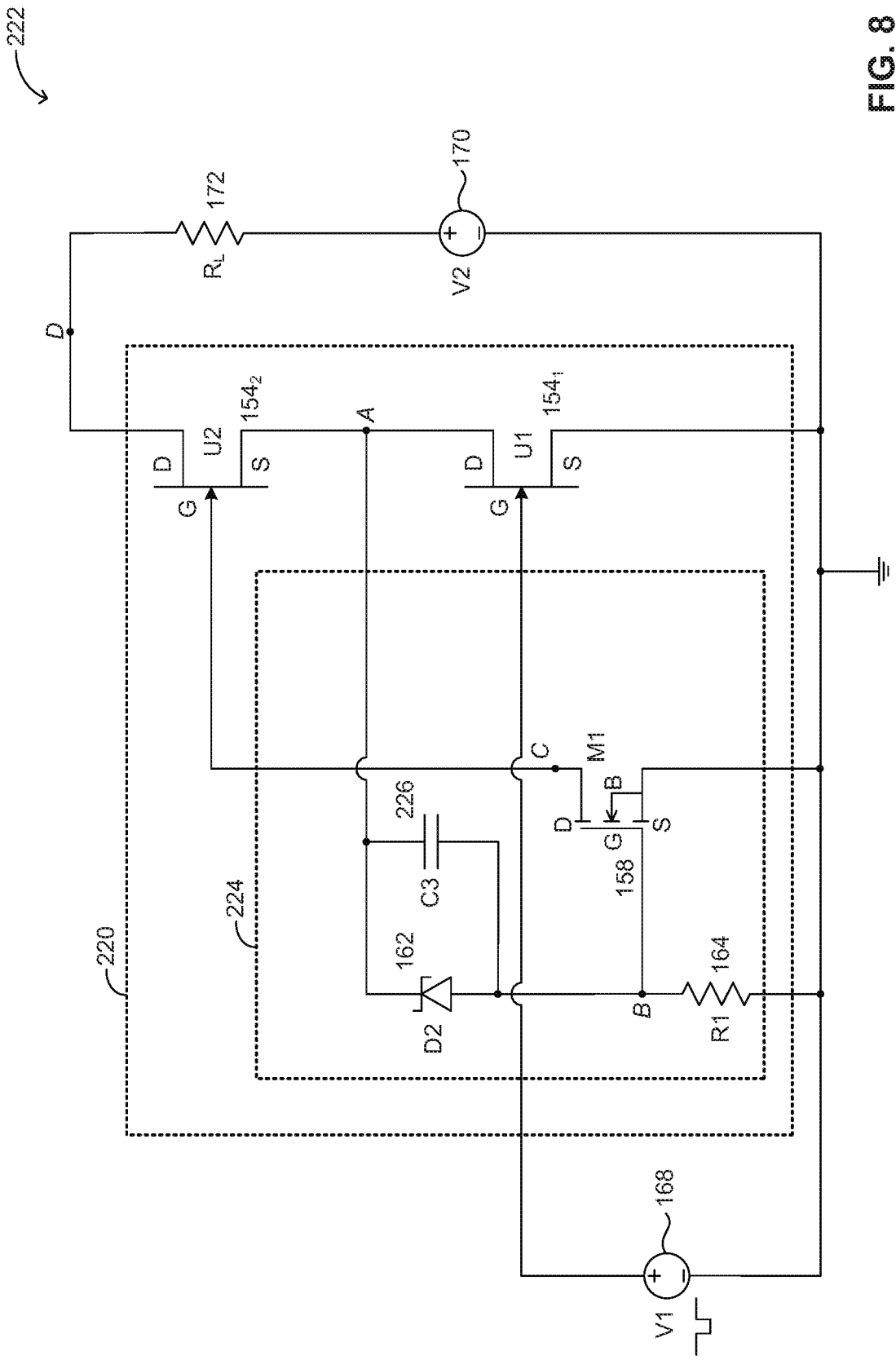
FIG. 8 is a schematic illustration of a further implementation of the high-voltage switching devices of FIGS. 2A-2C.

Reference is now made to FIG. 8, which is a schematic illustration of a further implementation of the high-voltage switching devices of FIGS. 2A-2C, generally referenced 220. FIG. 8 shows a high-voltage switching device 220, which is substantially similar in configuration, operation and function to high-voltage switching device 100 of FIG. 3B, apart from capacitor 160 (C2) (FIG. 3B) (now denoted capacitor 226 (C3) that is moved to be in parallel to Zener diode 162. The same numbered components as in FIG. 8 in FIG. 3B have the same function. Analogously to high-voltage switching device 100 of FIG. 3B, high-voltage switching device 220 is configured and operative to be coupled with peripheral devices (i.e., controller 168, high-voltage power source 160, and load 172). High-voltage switching device 220 along with the peripheral devices are collectively referenced 222 in FIG. 8. High-voltage switching device 220 functions similarly as high-voltage switching device 100 (FIGS. 1, 2A and 2B) with capacitor 226 in parallel to Zener diode 162 (and capacitor 160 removed). Essentially, transistor 154₁ switches off (i.e., after receiving a control signal from controller 168) causing the potential difference at point 'A' with respect to the ground to rise from zero toward the voltage V2. Capacitor 226 starts charging via the series RC circuit formed with resistor 164 before Zener diode 162 is operational. Consequently, a rising voltage drop on resistor 164 (i.e., the voltage at point 'B') induces a potential difference between gate and source terminals of transistor 158 (i.e., $V_{GS}(M1)$) above its threshold voltage $V_t(M1)$, which in turn causes it to switch on. The rising voltage at point 'A' eventually crosses the Zener voltage causing Zener diode 162 to be conductive. The voltage rise at point 'A' is limited by the sum of the Zener voltage of Zener diode 162 and the voltage drop on resistor 164 (i.e., $V_B$). Capacitor 226 is thus configured and operative to facilitate and expedite switching of transistor 158 so as to effectively synchronize switching times of transistors 154₁ and 154₂. Switching time synchronizer 108 (FIG. 2A) is mainly implemented by capacitor 226 (FIG. 8). Voltage limiter 110 (FIGS. 2A-2C) is mainly implemented by Zener diode 162 FIG. 3B).

Reference is now made to FIG. 9, which is a schematic block diagram of the high-voltage switching device of FIG. 2A, showing another coupling configuration between high-voltage switching device with a high-voltage power source and load, constructed and operative in accordance with the disclosed technique. FIG. 9 illustrates high-voltage switching device 100, high-voltage power source 114 and load 116 of FIG. 2A. High-voltage power source 114 and load 116 may be coupled in series with each other, and are configured and operative to couple with switching devices 104₁, 104₂, 104₃, ..., 104_N in general. High-voltage switching device 100 enables the high-voltage power source 114 and load 116 pair to be coupled such that one terminal (branch) of the pair is coupled to either one of switching devices #1 (104₁) through #N (104_N) while another terminal (branch) of the pair is coupled with a common ground of high-voltage switching device 100. The specific example coupling configurations shown in FIGS. 2A, 2B, and 2C demonstrate typical implementation in which the full range of the sum of blocking voltages (i.e., the "maximal blocking voltage") of switching devices 104₁, 104₂, 104₃, ..., 104_N are used. The more general coupling configuration shown in FIG. 9 demonstrates cases where blocking voltages less than (or equal to) the maximal blocking voltage may be implemented. For example, a voltage-balanced configuration according to the disclosed technique is where the switching voltage is distributed approximately equally among voltage drops upon switching devices 104₁, 104₂, 104₃, ..., 104_N such that each switching device sustains a blocking voltage equal approximately to 1/N of the switching voltage. According to this example, a coupling of the high-voltage power source and load pair to any switching device would enable the switching of a blocking voltage that is equal to about N-times the number of switching devices included in the range spanned by the different switching device with respect to the common ground. For example, a coupling configuration of the high-voltage power source and load pair to switching device $104_3$ would enable switching of 3 times the blocking voltage of a switching device (i.e., in a voltage-balanced circuit). In the case of a non-voltage-balanced circuit in which each switching device has a different blocking voltage or the switching voltage would be equally distributed among the switching devices, high-voltage power source 100 would enable switching of a switching voltage whose value is the sum of the individual blocking voltages of the respective switching devices.

Figure 10A:
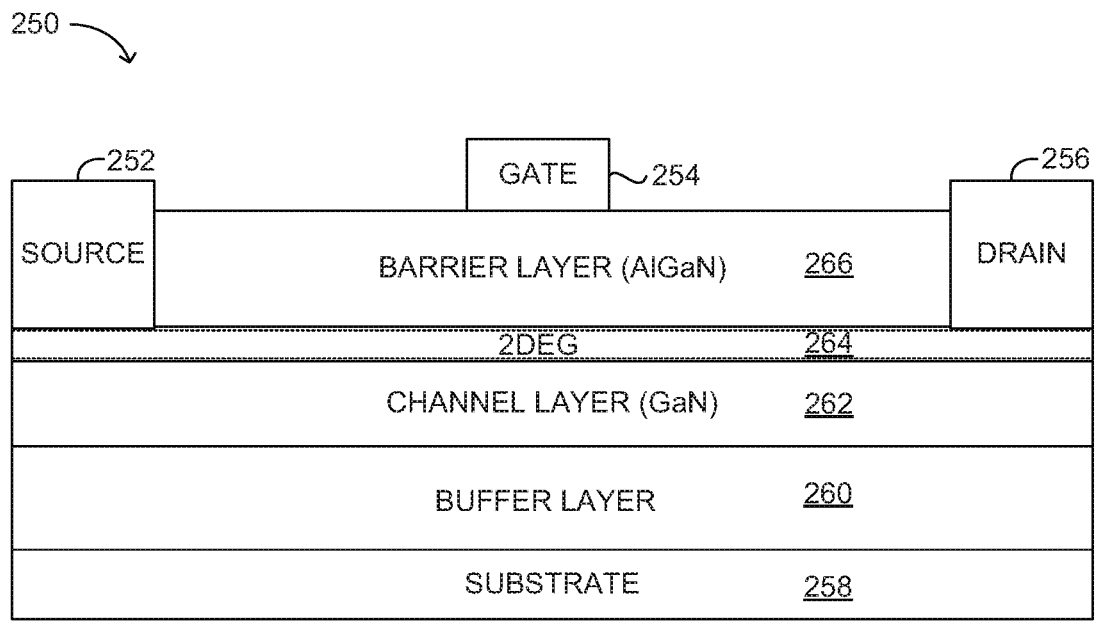
FIG. 10A is a schematic diagram of the physical structure of a GaN high-electron-mobility transistor (HEMT), constructed and operative with the embodiments of the disclosed technique.
Figure 10B:
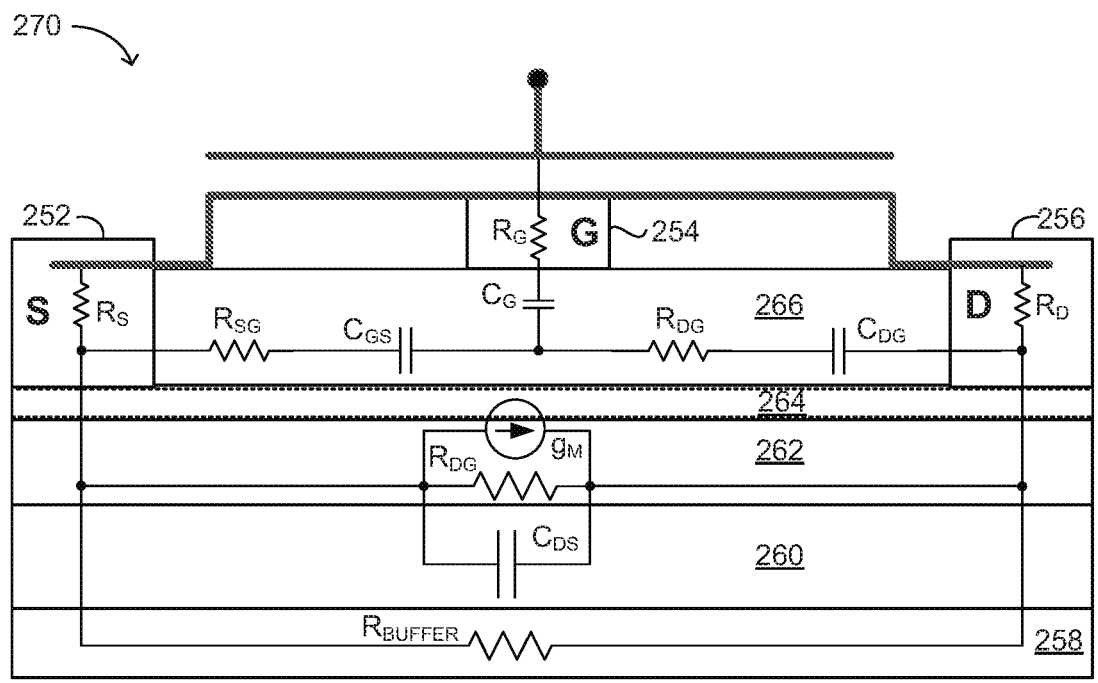
FIG. 10B is a schematic diagram of an equivalent circuit relating to a part of the physical structure of the transistor of FIG. 10A.
Figure 10C:
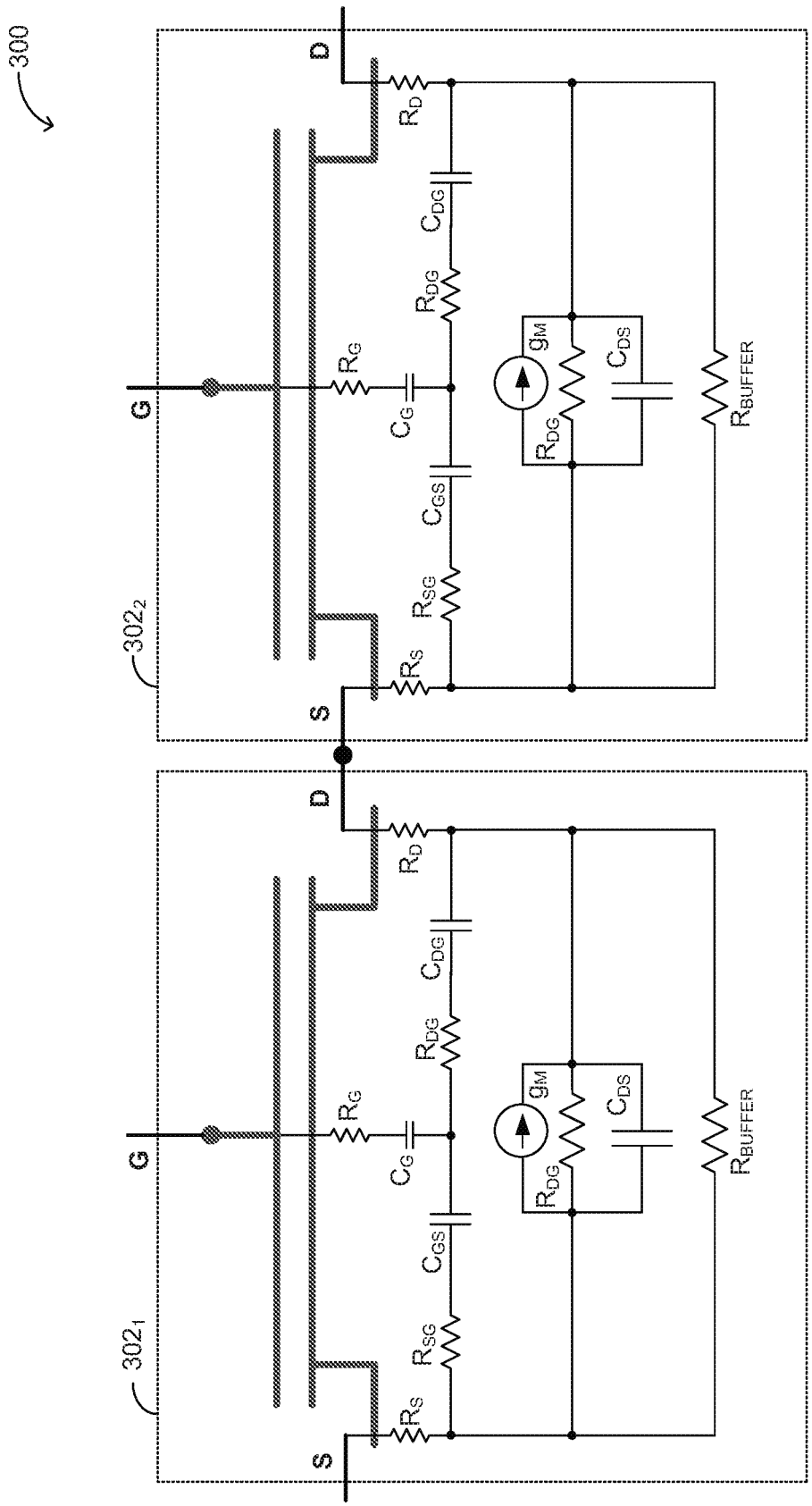
FIG. 10C is a schematic diagram of an equivalent circuit of two transistors of the type shown in FIG. 10A, connected in a series configuration, constructed and operative with the embodiments of the disclosed technique.
Figure 11:
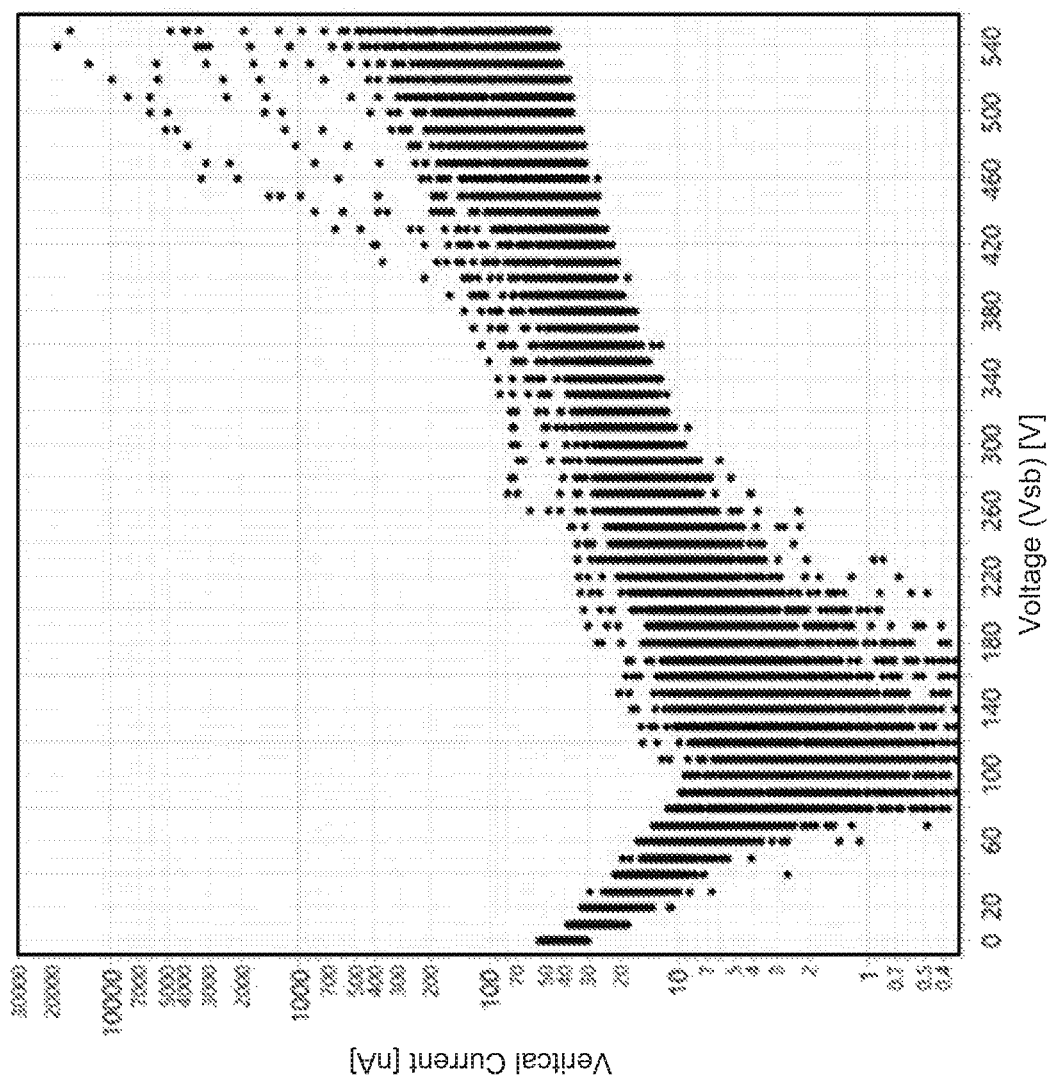
FIG. 11 is a schematic illustration of an I-V curve of leakage current flow through a buffer layer of the GaN HEMT transistor of FIGS. 10A and 10B.

Reference is now made to FIGS. 10A, 10B, 10C and FIG. 11. FIG. 10A is a schematic diagram of the physical structure of a GaN high-electron-mobility transistor (HEMT) transistor, generally referenced 250, constructed and operative with the embodiments of the disclosed technique. FIG. 10B is a schematic diagram of an equivalent circuit relating to part of the physical structure of the transistor of FIG. 10A, generally referenced 270. FIG. 10C is a schematic diagram of an equivalent circuit of two transistors of the type shown in FIG. 10A, connected in a series configuration, generally referenced 300, constructed and operative with the embodiments of the disclosed technique. FIG. 11 is a schematic illustration of an I-V curve of leakage current flow through a buffer layer of the GaN HEMT transistor of FIGS. 10A and 10B. FIGS. 10A and 10B show a GaN transistor 250 that includes a source terminal 252, a gate terminal 254, a drain terminal 256, a substrate layer 258, a buffer layer 260, a channel layer 262, a two-dimensional electron gas (2DEG) region 264, and a barrier layer 266. The composition of substrate layer 258 is selected from a list of possible materials that include silicon (Si), silicon carbide (SiC), and the like, including materials enabling buffer layer 260 that is composed from GaN/AlGaN layers to be epitaxially grown (e.g., GaN-on-Si, GaN-on-SiC). Buffer layer 260 is typically composed from super lattice GaN/AlGaN carbon doped GaN layers, and an un-intentionally doped (UID) GaN channel. Channel layer 262 is composed from GaN. A top AlGaN barrier layer induces a piezo-electric charge-2DEG at the interface with a bottom UID GaN layer. The carbon doped layer behaves like p-type doped material and forms a p-n junction with a corresponding n-channel of 2DEG 264 (i.e., in which electron motion is two-dimensional). Barrier layer 266 is disposed on top of channel layer 262, as shown in FIG. 10A.

In accordance with the principles of the disclosed technique the physical structure of transistor 250, employed in high-power switching devices (e.g., 100, 200, 220), enables a self-balancing characteristic such that the switching voltage is approximately equally distributed among the serially-coupled transistors thereby achieving a voltage-balanced circuit. Facilitation of this self-balancing characteristic is achieved at least in part via inherent characteristics of buffer layer 260. An equivalent circuit of buffer layer 260 may be represented for example, as shown in FIG. 10B. FIG. 10B shows discrete components of an exemplary equivalent circuit spanning through different layers in the physical structure of the transistor. Particularly, the equivalent circuit includes a resistor $R_{BUFFER}$ (i.e., representing the electrical resistance of substrate layer 258), a capacitor $C_{DS}$ (i.e., representing the drain-to-source capacitance), a resistor $R_{DS}$ (i.e., representing the drain-to-source resistance), a representation of the transconductance $g_M$, a resistor $R_S$ (i.e., representing the resistance of the source, a resistor $R_{SG}$ (i.e., representing the source-to-gate resistance), a capacitor $C_{GS}$ (i.e., representing the gate-to-source capacitance), a capacitor $C_G$ (i.e., representing the gate capacitance), a resistor $R_G$ (i.e., representing the gate resistance), a resistor $R_{DS}$ (i.e., representing the drain-to-gate resistance), a capacitor $C_{DG}$ (i.e., representing the drain-to-gate capacitance), and a resistor $R_D$ (i.e., representing the drain resistance).

With further reference to FIG. 10C, two similar transistors $302_1$, $302_2$ are connected to each other in a series configuration, such that the drain terminal (D) of transistor $302_1$ is connected to the source terminal (S) of transistor $302_2$. Transistors $302_1$, $302_2$ have identical physical structures, characteristics, functions, and equivalent circuits although in practice there might be slight statistical variations therebetween. According to a particular implementation of the disclosed technique transistors $302_1$ and $302_2$ respectively correspond to transistors $154_1$ and $154_2$ of FIG. 3. In effect, the similarity of the transistors as manifested by their respective equivalent circuits and components enables for a voltage divider configuration responsible for equalizing a voltage drop on each of transistors $302_1$ and $302_2$, as well as switching devices shown in FIGS. 2A, 2B, 2C, 3, 7, 8, and 9. The use of transistors having the same physical structure and size (e.g., as shown in FIGS. 10A and 10B) as well as the same equivalent circuits (as shown in FIG. 10C) further enables to achieve a voltage-balanced circuit. FIG. 11 illustrates an example of an I-V (current-to-voltage) curve 350 of leakage current flowing through buffer layer 260 from source to the substrate and its relationship with voltage $V_{sb}$ (bias on Si substrate). The initial current drop is related to the trap-filling effect and confirms the diode-like current behavior.

It will be appreciated by persons skilled in the art that the disclosed technique is not limited to what has been particularly shown and described hereinabove. Rather the scope of the disclosed technique is defined only by the claims, which follow.

The invention claimed is:

1. A device for switching a high-voltage source, comprising:
   a plurality of switching devices coupled in series starting from a first switching device and ending in a last switching device, said device enabling coupling of said high-voltage source with at least a selected one of said switching devices;
   a voltage limiter coupled with said switching devices; and
   a switching time synchronizer;
   wherein said first switching device is configured to directly receive a control signal for changing a switching state of said device, said first switching device is configured to facilitate a cascaded transition of switching states in successive said switching devices in said series, where said switching time synchronizer is configured to synchronize a time at which transitions to said switching states of successive said switching devices take effect, and said voltage limiter is configured to limit overvoltage conditions to said switching devices during said transitions, wherein said switching devices are of normally-ON type.

2. The device according to claim 1, wherein said switching devices are transistors.

3. The device according to claim 1, wherein said switching devices are configured to distribute an applied voltage of said high-voltage source equally among said switching devices.

4. The device according to claim 1, wherein said first switching device is configured for coupling to a controller that is configured to send said control signal for enabling said changing said switching state of said device.

5. The device according to claim 1, wherein the respective blocking voltage of each individual one of said switching devices is lower than an applied voltage of said high-voltage source.

6. The device according to claim 1, wherein said switching time synchronizer is further configured to minimize transition times between said switching states of individual said switching devices.

7. The device according to claim 1, wherein said voltage limiter is further configured to facilitate an even distribution of an applied voltage of said high-voltage source among said switching devices.

8. The device according to claim 1, wherein said voltage limiter is configured to limit a voltage drop across each one of said switching devices to be below its respective breakdown voltage.

9. The device according to claim 1, wherein said switching devices are fast-switching transistors.

10. The device according to claim 1, wherein said voltage limiter and said switching time synchronizer are coupled with said switching devices at coupling points that couple two successive said switching devices.

11. The device according to claim 10, wherein said voltage limiter is configured to maintain an even distribution of an applied voltage of said high-voltage source among said switching devices.

12. The device according to claim 10, wherein said switching time synchronizer is configured to generate at least one reference time signal for enabling time-synchronization of said switching states of said switching devices.

13. The device according to claim 1, further comprising at least one parallel-connected switching device that is connected in parallel to a respective one of said switching devices in said series.

14. The device according to claim 13, wherein each one of said switching devices is connected in parallel to at least one said parallel-connected switching device.

15. The device according to claim 1, wherein said switching devices are selected from a list consisting of:
field-effect transistor (FET);
junction gate field-effect transistor (JFET); and
Gallium Nitride (GaN) high-electron mobility transistor (HEMT).

16. The device according to claim 9, wherein each of said fast-switching transistors includes a gate terminal, a source terminal and a drain terminal, where the coupling in said series involves sequentially connecting said drain terminal of one of said switching devices to said source terminal of another successive one of said fast-switching transistors in said series.

17. The device according to claim 16, wherein said voltage limiter includes at least a reverse-biased diode connected to said gate terminal of a second switching device in said series.

18. The device according to claim 17, wherein said switching time synchronizer includes at least a capacitor connected to said gate terminal of said second switching device in said series.

19. The device according to claim 18, wherein said reverse-biased diode and said capacitor are connected in parallel.

20. The device according to claim 18, wherein said voltage limiter further includes a resistor forming a diode-resistor series-connection with said reverse-biased diode, where one branch said diode-resistor series-connection is connected to a coupling point between two successive said switching devices.

21. The device according to claim 20, wherein the reverse breakdown voltage of said reverse-biased diode is selected such to divide an applied voltage of said high-voltage source equally between said two successive said switching devices.

22. The device according to claim 20, wherein said switching time synchronizer further includes a switching transistor including: a gate terminal that is coupled at a coupling point of said diode-resistor series-connection; a drain terminal and a source terminal that are connected in parallel with said capacitor.

23. The device according to claim 1, wherein said switching time synchronizer is configured to synchronize said transitions of said switching states of said switching devices so to occur simultaneously.

24. The device according to claim 22, further comprising current limiting resistors each of which is connected in series to a respective said gate terminal of a respective one of said fast-switching transistors.

25. The device according to claim 16, wherein said switching time synchronizer includes a capacitor, and said voltage limiter includes a reverse-biased diode connected in parallel to said capacitor thereby forming a diode-capacitor parallel circuit having one branch coupled at a coupling point between two successive said switching devices.

26. The device according to claim 25, wherein another branch of said diode-capacitor parallel circuit is coupled with a resistor.

27. The device according to claim 17, wherein said reverse-biased diode is of a type selected from a Zener diode; and a transient-voltage-suppression (TVS) diode.

28. The device according to claim 22, wherein said switching transistor is of a type selected from a metal-oxide-semiconductor field-effect transistor (MOSFET);
and a bipolar junction transistor (BJT).

29. The device according to claim 1, wherein said device enables switching of a series-connected pair that includes said high-voltage source and a load, where one branch of said series-connected pair is enabled for coupling with one of said switching devices and another branch is enabled for coupling with a common ground of said device, such that each one of said switching devices sustains an applied voltage of said high-voltage source that is equal to the reciprocal of the number of said switching devices.

30. The device according to claim 1, wherein said switching devices are Gallium Nitrite (GaN) transistors each having a physical structure that includes a drain terminal, a source terminal, a gate terminal that is on top of a barrier layer that is on top of a two-dimensional electron gas (2DEG) region that is on top of a channel layer that is on top of a buffer layer that is on top of a substrate.

31. The device according to claim 30, wherein said buffer layer is composed from either one of: (1) GaN/AlGaN layers; and (2) GaN/AlGaN carbon-doped GaN layers and an un-intentionally doped (UID) GaN channel.

32. The device according to claim 31, wherein said physical structure enables equalization of voltage drops among said switching devices.

* * * * *